United States Patent
Chung

(10) Patent No.: US 9,136,261 B2
(45) Date of Patent: Sep. 15, 2015

(54) STRUCTURES AND TECHNIQUES FOR USING MESH-STRUCTURE DIODES FOR ELECTRO-STATIC DISCHARGE (ESD) PROTECTION

(71) Applicant: Shine C. Chung, San Jose, CA (US)

(72) Inventor: Shine C. Chung, San Jose, CA (US)

(*) Notice: Subject to any disclaimer, the term of this patent is extended or adjusted under 35 U.S.C. 154(b) by 0 days.

(21) Appl. No.: 13/833,067

(22) Filed: Mar. 15, 2013

(65) Prior Publication Data
US 2013/0200488 A1  Aug. 8, 2013

Related U.S. Application Data

(63) Continuation-in-part of application No. 13/678,541, filed on Nov. 15, 2012, now abandoned.

(60) Provisional application No. 61/560,173, filed on Nov. 15, 2011.

(51) Int. Cl.
*H01L 21/70* (2006.01)
*H01L 27/02* (2006.01)
*H01L 29/868* (2006.01)

(52) U.S. Cl.
CPC ........ *H01L 27/0255* (2013.01); *H01L 27/0296* (2013.01); *H01L 29/868* (2013.01)

(58) Field of Classification Search
CPC .................................................. H01L 27/0255
USPC ........................................................ 257/510
See application file for complete search history.

(56) References Cited

U.S. PATENT DOCUMENTS 3,198,670 A    8/1965  Nissim
3,715,242 A    2/1973  Daniel
(Continued)

FOREIGN PATENT DOCUMENTS

CN    1469473 A    1/2004
CN    1691204 A    11/2005
(Continued)

OTHER PUBLICATIONS

Alavi, Mohsen, et al., "A PROM Element Based on Salicide Allgomeration of Poly Fuses in a CMOS Logic Process," IEEE IEDM, 97, pp. 855-858.
(Continued)

*Primary Examiner* — Bilkis Jahan

(57) ABSTRACT

An Electro-Static Discharge (ESD) protection using at least one I/O pad with at least one mesh structure of diodes provided on a semiconductor body is disclosed. The mesh structure has a plurality of cells. At least one cell can have a first type of implant surrounded by at least one cell with a second type of implant in at least one side of the cell, and at least cell can have a second type of implant surrounded by at least one cell with a first type of implant in at least one side of the cell. The two types of implant regions can be separated with a gap. A silicide block layer (SBL) can cover the gap and overlap into the both implant regions to construct P/N junctions on the polysilicon or active-region body on an insulated substrate. Alternatively, the two types of implant regions can be isolated by LOCOS, STI, dummy gate, or SBL on silicon substrate. The regions with the first and the second type of implants can be coupled to serve as the first and second terminal of a diode, respectively. The mesh structure can have a first terminal coupled to the I/O pad and a first terminal coupled to a first supply voltage.

17 Claims, 13 Drawing Sheets

(56) References Cited

U.S. PATENT DOCUMENTS

| | | |
|---|---|---|
| 4,148,046 A | 4/1979 | Hendrickson et al. |
| 4,192,059 A | 3/1980 | Khan et al. |
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |
| 5,635,742 A | 6/1997 | Hoshi et al. |
| 5,637,901 A | 6/1997 | Beigel et al. |
| 5,723,890 A | 3/1998 | Fujihira et al. |
| 5,757,046 A * | 5/1998 | Fujihira et al. ............... 257/339 |
| 5,761,148 A | 6/1998 | Allan et al. |
| 5,962,903 A | 10/1999 | Sung et al. |
| 6,002,156 A * | 12/1999 | Lin ............................. 257/356 |
| 6,008,092 A | 12/1999 | Gould |
| 6,034,882 A | 3/2000 | Johnson et al. |
| 6,140,687 A | 10/2000 | Shimormura et al. |
| 6,243,864 B1 | 6/2001 | Odani et al. |
| 6,346,727 B1 | 2/2002 | Ohtomo |
| 6,388,292 B1 * | 5/2002 | Lin ............................. 257/356 |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,211,843 B2 | 5/2007 | Low et al. |
| 7,212,432 B2 | 5/2007 | Ferrant et al. |
| 7,224,598 B2 | 5/2007 | Perner |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 | 9/2009 | Oh et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,808,815 B2 | 10/2010 | Ro et al. |
| 7,830,697 B2 | 11/2010 | Herner |
| 7,833,823 B2 | 11/2010 | Klersy |
| 7,859,920 B2 | 12/2010 | Jung |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Lu et al. |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,514,606 B2 * | 8/2013 | Chung ............................. 365/96 |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,699,259 B2 | 4/2014 | Zhang et al. |
| 8,760,904 B2 | 6/2014 | Chung |
| 8,817,563 B2 | 8/2014 | Chung |
| 8,830,720 B2 * | 9/2014 | Chung ............................. 365/96 |
| 8,854,859 B2 * | 10/2014 | Chung ........................... 365/148 |
| 8,861,249 B2 | 10/2014 | Chung |
| 8,913,415 B2 | 12/2014 | Chung |
| 8,913,449 B2 | 12/2014 | Chung |
| 8,923,085 B2 | 12/2014 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 2002/0168821 A1 * | 11/2002 | Williams et al. .............. 438/268 |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansai et al. |
| 2006/0215440 A1 | 9/2006 | Cho et al. |
| 2006/0244099 A1 | 11/2006 | Kurjanowicz |
| 2007/0004160 A1 * | 1/2007 | Voldman ....................... 438/309 |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0170429 A1 | 7/2008 | Bertin et al. |
| 2008/0175060 A1 | 7/2008 | Lie et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2009/0055617 A1 | 2/2009 | Bansai et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0062557 A1 | 3/2011 | Bandyopadhyay et al. |
| 2011/0128772 A1 | 6/2011 | Kim et al. |
| 2011/0145777 A1 | 6/2011 | Iyer et al. |

(56) References Cited

U.S. PATENT DOCUMENTS

| | | |
|---|---|---|
| 2011/0175199 A1 | 7/2011 | Lin et al. |
| 2011/0222330 A1 | 9/2011 | Lee et al. |
| 2011/0260289 A1 | 10/2011 | Oyamada |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1* | 10/2012 | Yu et al. .................. 257/510 |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0215663 A1 | 8/2013 | Chung |
| 2013/0235644 A1 | 9/2013 | Chung |
| 2013/0268526 A1 | 10/2013 | Johns et al. |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0124871 A1 | 5/2014 | Ko et al. |
| 2014/0124895 A1 | 5/2014 | Salzman et al. |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0211567 A1 | 7/2014 | Chung |
| 2014/0269135 A1 | 9/2014 | Chung |
| 2015/0009743 A1 | 1/2015 | Chung |
| 2015/0021543 A1 | 1/2015 | Chung |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 10/2007 |

OTHER PUBLICATIONS

Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.

Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.

Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.

Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.

Banerjee, Kaustav et al., "High Current Effects in Salicide Films for Sub-0.25um VLSI Technologies," IEEE 36th IRPS, 1998, pp. 284-292.

Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.

Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.

Bedeschi, F. et al., "A Fully Symmetrical Sense Amplifier for Non-volatile Memories," IEEE. Int. Symp. on Circuits and Systems, (ISCAS), vol. 2, 2004, pp. 625-628.

Bedeschi, F. et al., "An 8Mb Demonstrator for High-Density 1.8V Phase-Change Memories," VLIS Cir. Symp, Jun. 2004, pp. 442-445.

Bedeschi, F. et al., "SET and RESET Pulse Characterization in BJT-Selected Phase-Change Memory," IEEE Int. Symp. on Circuits and Systems (ISCAS), 2005, pp. 1270-1273.

Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.

Cagli, C. et al., "Evidence for threshold switching in the set process of NiO-based RRAM and physical modeling for set, reset, retention and disturb prediction," IEEE IEDM, 2008, pp. 1-4.

Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.

Notice of Allowance for U.S. Appl. No. 13/590,044, mailed Apr. 29, 2014.

Notice of Allowance for U.S. Appl. No. 13/954,831, mailed May 27, 2014.

Notice of Allowance of U.S. Appl. No. 13/833,044, mailed May 29, 2014.

Notice of Allowance for U.S. Appl. No. 13/761,048, mailed Jun. 10, 2014.

Office Action for Taiwanese Patent Application No. 100129642, mailed May 19, 2014 (with translation).

Office Action for U.S. Appl. No. 13/072,783, mailed Nov. 7, 2013.

Notice of Allowance for U.S. Appl. No. 13/026,840, mailed Jun. 24, 2014.

Notice of Allowance for U.S. Appl. No. 13/214,198, mailed Jun. 23, 2014.

Notice of Allowance for U.S. Appl. No. 13/590,044, mailed Jun. 23, 2014.

Ker et al., "MOS-bounded diodes for on-chip ESD protection in a 0.15-μm shallow-trench-isolation salicided CMOS Process" International Symposium on VLSI Technology, Systems and Applications, 2003, 5 pgs.

Notice of Allowance for U.S. Appl. No. 13/840,965, mailed Jun. 25, 2014.

Office Action for U.S. Appl. No. 13/970,562, mailed Jun. 27, 2014.

Office Action for U.S. Appl. No. 13/835,308, mailed Jun. 27, 2014.

Notice of Allowance for U.S. Appl. No. 13/288,843, mailed Jul. 8, 2014.

Restriction Requirement for U.S. Appl. No. 13/678,539, mailed Jul. 1, 2014.

Notice of Allowance for U.S. Appl. No. 14/231,413, mailed Jul. 18, 2014.

(56) References Cited

OTHER PUBLICATIONS

Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.

(56) References Cited

OTHER PUBLICATIONS

Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-AM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology," 7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawhara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol., 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.

Lee, H.Y. et al., "Low Power and High Speed Bipolar Switching with a Thin Reactive Ti Buffer Layer in Robust HfO2 Based RRAM" IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. on Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.

(56) References Cited

OTHER PUBLICATIONS

Rizzolo, R. F. et al., "IBM System z9 eFUSE applications and methodology," IBM J. Res. & Dev. vol. 51 No. 1/2 Jan./Mar. 2007, pp. 65-75.
Robson, Norm et al., "Electrically Programmable Fuse (eFuse) from Memory Redundancy to Autonomic Chips," IEEE CICC 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rd. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.

(56) References Cited

OTHER PUBLICATIONS

Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo. cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Herner et al., "Vertical p-i-n. Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Dec. 31, 2014.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014 (with translation).
Notice of Allowance for U.S. Appl. No. 13/970,562, mailed Jan. 23, 2015.
Notice of Allowance for U.S. Appl. No. 14/493,069, mailed Feb. 17, 2015.

(56) References Cited

OTHER PUBLICATIONS

Notice of Allowance for U.S. Appl. No. 14/085,228, mailed Feb. 18, 2015.
Notice of Allowance for U.S. Appl. No. 13/761,045, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.
Final Office Action for U.S. Appl. No. 13/678,544, mailed Feb. 15, 2015.
Office Action for U.S. Appl. No. 14/101,125, mailed Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, mailed on Mar. 5, 2015.
Final Office Action for U.S. Appl. No. 13/678,539, mailed Apr. 1, 2015.
Office Action for U.S. Appl. No. 14/636,155, mailed on Apr. 10, 2015.
Notice of Allowance for U.S. Appl. No. 14/021,990, mailed Apr. 14, 2015.
Notice of Allowance for U.S. Appl. No. 13,842,824, mailed Apr. 14, 2015.
Notice of Allowance for U.S. Appl. No. 14/071,957, mailed Apr. 14, 2014.
Notice of Allowance for U.S. Appl. No. 14/231,404, mailed Apr. 17, 2015.
Notice of Allowance for U.S. Appl. No. 13/590,444, mailed May 12, 2015.
U.S. Appl. No. 13/471,704, filed May 15, 2012.
U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.

\* cited by examiner

STRUCTURES AND TECHNIQUES FOR USING MESH-STRUCTURE DIODES FOR ELECTRO-STATIC DISCHARGE (ESD) PROTECTION

CROSS-REFERENCE TO RELATED APPLICATIONS

This application is a continuation-in-part of U.S. patent application Ser. No. 13/678,541, filed on Nov. 15, 2012 and entitled "STRUCTURES AND TECHNIQUES FOR USING MESH-STRUCTURE DIODES FOR ELECTRO-STATIC DISCHARGE (ESD) PROTECTION," which is hereby incorporated herein by reference, which in turn claims priority benefit of U.S. Provisional Patent Application No. 61/560,173, filed on Nov. 15, 2011 and entitled "Using Mesh-Structure of Polysilicon Diodes for Electro-Static Discharge (ESD) Protection," which is hereby incorporated herein by reference.

BACKGROUND OF THE INVENTION

1. Field of the Invention

The present invention relates to Electro-Static Discharge (ESD) protection, i.e. using mechanism, device, circuit, apparatus, or any means to protection an integrated circuit from ESD damages.

2. Description of the Related Art

Human bodies may carry a lot of electrostatic charges. When an integrated circuit is touched by a human bodies during handling, a very high voltage (~5 KV) and a high current (~2 A) may be generated that can damage a delicate integrated circuit. The high voltage generated may breakdown MOS gate oxides, and the high power generated by high current may damage the metallurgical junctions. To protect an integrated circuit from ESD damages, the high voltage must be clamped, the high current must be limited, and the high heat generated from the high power consumption must be quickly dissipated to protect against temperature damage.

ESD protection becomes more important in today's semiconductor industry for several reasons. Firstly, as gate oxide of the MOS devices becomes thinner, it becomes more vulnerable to ESD damages due to aggressive scaling. Secondly, the threshold voltage of MOS devices in the core logic is lower from 0.7V to about 0.4V, and the breakdown voltage is lower from 5-7V to about 3-4V that can easily escape from the junction diodes' protection. Thirdly, high speed and high frequency circuits in an integrated circuit require very small input capacitance and yet good ESD protection. However, good ESD protection often requires large silicon area and high input capacitance. Therefore, the ESD protection issues deserve revisiting in today's nanometer devices.

FIG. 1 shows a prior art ESD protection device 10 that has an I/O pad 13 protected by two junction diodes 12 and 11. The P terminal of the diode 12 is coupled to VSS and the N terminal is coupled to the I/O pad 13. Similarly, the P terminal of the diode 11 is coupled to the I/O pad 13 and the N terminal is coupled to the VDD. The junction diodes 12 and 11 have a turn-on voltage of about 0.7V and a breakdown voltage of about 5V, for example. When a high positive voltage is applied to the I/O pad 13, the I/O pad 13 can be clamped to VDD+0.7 if the diode 11 is turned on and can be clamped to 5V, if the diode 12 is broken down. Similarly, when a high negative voltage is applied to the I/O pad 13, the I/O pad can be clamped to −0.7V if the diode 12 is turned on and can be clamped to VDD-5V if the diode 11 is broken down. Thus, the high voltage of −3 KV can be clamped to a very low voltage.

The high heat generated by the high current during diode turn-on or breakdown can be quickly dissipated by guard rings surrounding the P terminal or N terminal of the diodes. The area of the diodes tends to be very large for better ESD immunity, but the large area is relatively costly.

FIG. 2 shows a conventional ESD protection device 20 for CMOS technologies that has an I/O pad 23 protected by two MOS devices connected as diodes 22 and 21. The P terminal of the diode 22 is coupled to VSS and the N terminal is coupled to the I/O pad 23. Similarly, the P terminal of the diode 21 is coupled to the I/O pad 23 and the N terminal is coupled to the VDD. The MOS diodes 22 and 21 have a turn-on voltage of about 0.6-0.7V and a breakdown voltage of about 4-5V depending on the MOS technologies. When a high positive voltage is applied to the I/O pad 23, the I/O pad 23 can be clamped to VDD+0.7, if the diode 21 is turned on and can be clamped to 5V if the diode 22 is broken down. Similarly, when a high negative voltage is applied to the I/O pad 23, the I/O pad can be clamped to −0.7V if the diode 22 is turned on and can be clamped to VDD−5V if the diode 21 is broken down. Thus, the high voltage of ~3 KV can be clamped to a very low voltage. Other than the MOS connected as diodes to protect integrated circuits, the junction diodes in source/drain of the MOS devices 21 and 22 can also serve for protection. In other embodiments, the ESD protection can be based on source/drain of the MOS 21 and 22 while the gates of the MOS 21 and 22 are configured as output drivers.

A diode can be fabricated from polysilicon. FIG. 3(a) shows a cross section of a polysilicon diode. To form a polysilicon diode, a polysilicon is implanted by N+ at one end and P+ at the other end with a spacing Lc in between that has intrinsic doping level. The intrinsic doping level only means not intentionally doped with any dopants but can be slightly N type or P type due to out diffusion or contamination. A silicide block layer is applied to block silicide formation on the surface of the polysilicon to thus prevent a short circuit. The two ends of P+ and N+ in polysilicon are further brought out as P and N terminals of a diode through contacts, vias, or metals. As an example of a polysilicon diode, see Ming-Dou Ker et al., "Ultra High-Voltage Charge Pump Circuit in Low-Voltage Bulk CMOS Processes with Polysilicon Diodes," IEEE Transaction of Circuit and System-II, Vol. 54, No. 1, January 2007, pp. 47-51.

FIG. 3(b) shows current verses voltage characteristics of a polysilicon diode, such as shown in FIG. 3(a). The current verses voltage curves show useful diode behavior such as a threshold voltage of about 0.6V and a leakage current of less than 1 nA. By varying the spacing Lc, the breakdown voltage and leakage current of the polysilicon diode can be adjusted accordingly.

Polysilicon diodes can be used for ESD protection, refer to Ming-Dou Ker et al, "High-Current Characterization of Polysilicon Diode for Electrostatic Discharge Protection in Sub-Quarter-Micron Complementary Metal Oxide Semiconductor Technology," Jpn. J. Appl. Phys. Vol. 42, 2003, pp. 3377-3378. Polysilicon structures for ESD protection in the prior arts are about a one-piece rectangular structure, which has rooms for improvements. Thus, there is still a need to use an optimized polysilicon diode structure to achieve higher ESD voltage, lower input capacitance, smaller area, and lower heat generated in today's giga-Hertz circuits.

SUMMARY

Embodiments of ESD protection using mesh structures of diodes are disclosed. The diodes constructed from polysilicon or active region body can be fabricated from standard bulk or SOI CMOS logic processes to achieve high ESD immunity, low input capacitance, small I/O size and low cost.

In one embodiment, the ESD protection can be constructed from diodes in at least one mesh structure, i.e. the diodes are constructed in a two-dimensional array of cells with at least one diode on at least one side of at least one cell. The diodes can be constructed from at least one polysilicon structure, insulated active region in SOI process, or junction diode in standard CMOS process. The mesh structure of diodes can be comparable to the I/O pad size and/or can be hidden underneath the I/O pad partially or wholly. One mesh-structure diode can have a P terminal coupled to the I/O pad and an N terminal coupled to VDD. Another mesh-structure diode can have a P terminal coupled to the VSS and an N terminal coupled to the I/O pad. In one embodiment, the P or N terminal of the diodes in at least one side of at least one cell is coupled to VDD, VSS, or I/O pad through Active Areas (AAs) so that the heat generated in the diode structure can be quickly dissipated. Advantageously, the same diode structure can be used to create CMOS gates, sources, drains or interconnects in standard CMOS logic processes. The input capacitance using diodes in mesh structures can be smaller than that in the conventional junction diodes or MOS connected as diodes with the same ESD performance. In particularly, the turn-on voltage of the polysilicon diodes is about 0.6V, smaller than 0.7V of junction diodes so that the polysilicon diodes can be turned earlier. The breakdown voltage of the polysilicon or active-region diodes can be easily changed by adjusting the spacing of the P+ and N+ implants. Thus, high performance and low cost ESD protection can be realized.

The invention can be implemented in numerous ways, including as a method, system, device, or apparatus (including graphical user interface and computer readable medium). Several embodiments of the invention are discussed below.

As a diode constructed in a mesh structure including a plurality of cells on a semiconductor body, one embodiment of the mesh structure includes at least: at least one cell with a first type of implant surrounded by at least one cell with a second type of implant in at least one side; at least one cell with the second type of implant surrounded by at least one cell with the first type of implant in at least one side; and an isolation region between the first and the second type of implants to form P/N junctions in at least one side of the cell on the semiconductor body. In addition, regions with the first implant can be coupled to serve as a first terminal of the diode, and regions with the second implant can be coupled to serve as a second terminal of the diode.

As an ESD protection structure in an integrated circuit, one embodiment of the ESD protection circuit can, for example, include at least an I/O pad and at least one mesh structure including plurality of cells on a semiconductor body. The at least one mesh structure can include at least: at least one of the cells having a first type of implant surrounded by at least one of the cells with a second type of implant in at least one side of the cell; at least one of the cells with a second type of implant surrounded by at least one of the cells with a first type of implant in at least one side of the cell; and an isolation region between the first and the second type of implant regions to form P/N junctions in at least one side of the cell on the semiconductor body. The regions with the first implant can be coupled to serve as a first terminal of the at least one diode, and the regions with the second implant can be coupled to serve as a second terminal of the at least one diode. The first terminal of the at least one diode can be coupled to the I/O pad while the second terminal can be coupled to a supply voltage.

As an electronic system, one embodiment can, for example, include at least one integrated circuit including at least one ESD protection structure that has a mesh structure of cells on a semiconductor body, and has at least one diode formed in the mesh structure. The mesh structure can include at least: at least one of the cells with a first type of implant surrounded by at least one cells with a second type of implant in at least one side, and at least one of the cells with a second type of implant surrounded by at least one cells with a first type of implant in at least one side; and an isolation between the first and the second implant regions in at least one side of the cells to construct P/N junctions on the polysilicon substrate. The first and the second type of implant regions can serve as the first and the second terminals of the at least one diode. The first terminal of the diode can be coupled to an I/O pad and the second terminal of the diode can be coupled to a supply voltage to protect the devices and/or circuits coupled to the I/O pad from high voltage surges.

As a method for providing an Electro-Static Discharge (ESD) protection, one embodiment can, for example, include at least: providing at least one mesh structure containing plurality of cells on a semiconductor body, the mesh structure including at least (i) a first type of implant in a cell surrounded by at least one cell with a second type of implant in at least one side; (ii) a second type of implant in a cell surrounded by at least one cell with a first type of implant in at least one side, (iii) an isolation between the first and the second type of implant regions to construct a P/N junction on the semiconductor body; and (iv) the cells with the first and second types of implants coupled as a first and a second terminals of at least one diode, respectively; coupling the first terminal of the at least one diode to an I/O pad; and coupling the second terminal of the at least one diode coupled to a supply voltage. The diode can protect devices and/or circuits coupled to the I/O pad from high voltage surges.

As an ESD device, one embodiment can, for example, include at least one mesh having a plurality of cells with at least one diode on at least one side of at least one cell. The diode can be on a polysilicon or active-region body on an insulated substrate. The diode can also be a junction diode on a silicon substrate. The cells with P+ implant can be surrounded by cells with N+ implant on at least one side, and the cells with N+ implant can be surrounded by cells with P+ implant on at least one side. The P+ and N+ implant regions in the adjacent cells can be separated with a space (or an isolation), such as LOCOS (LOCal oxidation), STI (Shallow Trench Isolation), dummy gate, or SBL (Silicide Block Layer), A silicide block layer can cover the space and at least partially overlap into both implant regions to construct P and N terminals of a diode. At least one of the cells in the mesh can include at least one diode with a P terminal coupled to an I/O pad and an N terminal coupled to VDD. At least one of the cells in another mesh can include at least one diode with a P terminal coupled to VSS and an N terminal coupled to the I/O pad. In addition, the P or N terminal of the diodes coupled to VDD, VSS, or I/O pad can be through contacts or vias to metals and/or through active areas to a thermally conductive substrate.

As an electronic system, one embodiment can, for example, include at least one Print Circuit Board (PCB), and at least one integrated circuit operatively connected to the PCB. The integrated circuit can include at least a plurality of I/O structures for input or output purposes. At least one of the I/O structures can include at least one I/O pad and at least one mesh structure of cells with at least one diode on at least one side of at least one cell. The diode can be on a polysilicon or active-region body on an insulated substrate. Alternatively, the diode can also be a junction diode on a silicon substrate. The cells with P+ implant can be surrounded by cells with N+ implant on at least one side, and the cells with N+ implant can be surrounded by cells with P+ implant on at least one side. The P+ and N+ implant regions in the adjacent cells can be separated with a space (or an isolation), such as LOCOS, STI, dummy gate, or SBL. A silicide block layer can cover the space and at least partially overlap into both implant regions to construct P and N terminals of a diode. At least one cell has at least one diode with a P terminal coupled to an I/O pad and an N terminal coupled to VDD. Also, at least one cell has at least one diode with the P terminal coupled to VSS and the N terminal coupled to the I/O pad. Also, the P or N terminal of the diodes can be coupled to VDD, VSS, or I/O pads through contacts, vias, or metals, and/or through active areas to a thermally conductive substrate. The contour of the cells in the mesh structures can be circle, rectangle, triangle, hexagon, polygon, or other shapes.

As a method for providing an Electro-Static Discharge (ESD) protection, one embodiment includes at least: providing at least one mesh structure containing plurality of cells on a semiconductor body. The mesh structure can includes at least (i) a first type of implant in a cell surrounded by at least one cell with a second type of implant in at least one side; (ii) a second type of implant in a cell surrounded by at least one cell with a first type of implant in at least one side, (iii) an isolation between the first and the second type of implant regions to construct a P/N junction on the semiconductor body; and (iv) the cells with the first and second types of implants coupled as a first and a second terminals of at least one diode, respectively. The method can also include coupling the first terminal of the at least one diode to an I/O pad, and coupling the second terminal of the at least one diode coupled to a supply voltage. The diode can protect devices and/or circuits coupled to the I/O pad from high voltage surges.

Other aspects and advantages of the invention will become apparent from the following detailed description taken in conjunction with the accompanying drawings which illustrate, by way of example, the principles of the invention.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF EMBODIMENTS OF THE INVENTION

Embodiments disclosed herein use an ESD structure having a mesh structure of cells with at least one diode on at least one side of at least one cell. The contours of the cells in the mesh can be circle, rectangle, square, triangle, hexagon, or other shapes with polysilicon, active-region, or junction diodes built on at least one side. The diodes can comprise P+ and N+ implants on a polysilicon, active region on an insulated substrate or junction diodes on a silicon substrate. The P+ and N+ implants regions can be separated by a gap (or isolation), such as LOCOS (LOCalI Oxidation), STI (Shallow Trench Isolation), dummy gate, or silicide block layer (SBL). The gap can be covered by a silicide block layer (SBL) and overlapping into at least a portion of both P+ and N+ implant areas to form P/N junctions on the insulated or silicon substrate. The diodes can also be constructed from junction diodes with at least one N+ active region on a P substrate or at least one P+ active region on an N well. The isolation between the N and P terminals of the diodes can be LOCOS, STI, dummy gate, or SBL in standard CMOS processes. Since the P+ and N+ implants and polysilicon/active region are readily available in standard CMOS logic processes, these devices can be formed in an efficient and cost effective manner. This can be achieved with no additional masks or process steps to save costs. The ESD protection device can also be included within an electronic system.

Figure 1:
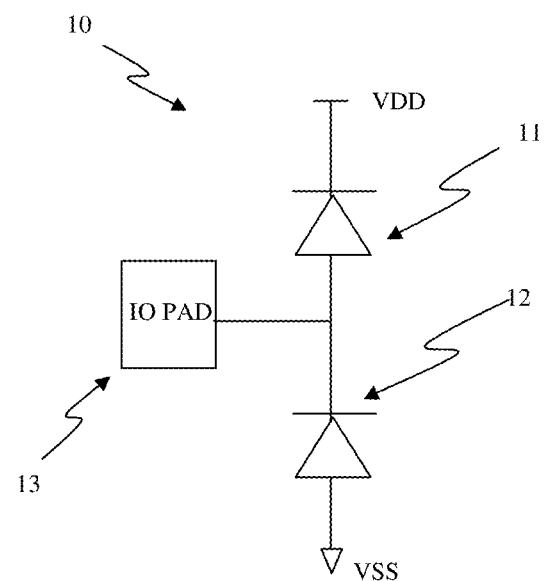
FIG. 1 shows a prior art of ESD protection using diodes.
Figure 2:
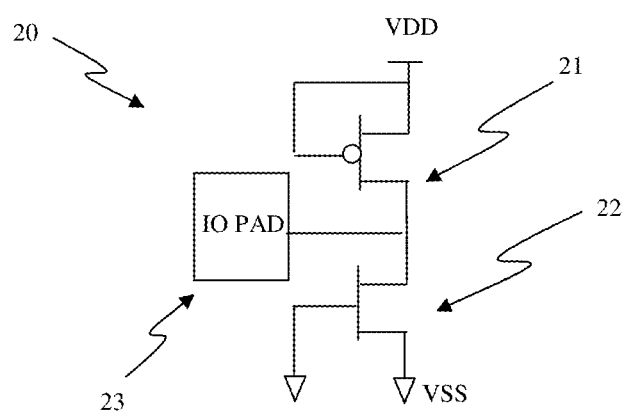
FIG. 2 shows a conventional ESD protection using MOS connected as diodes.
Figure 3A:
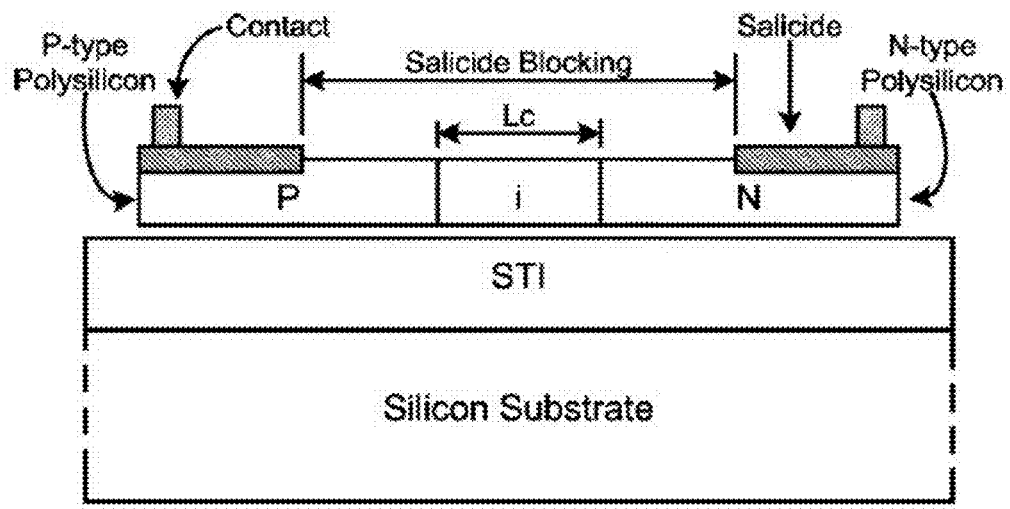
FIG. 3(a) shows a cross section of a polysilicon diode.
Figure 3B:
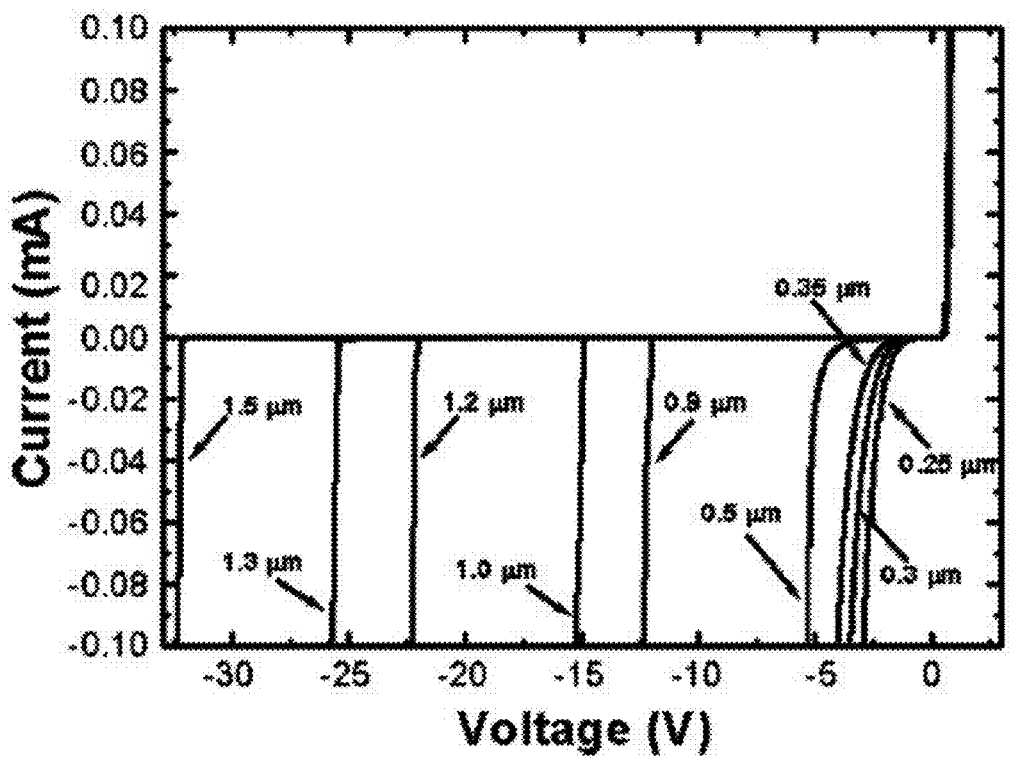
FIG. 3(b) shows current verses voltage characteristics of a polysilicon diode, such as shown in FIG. 3(a).
Figure 4:
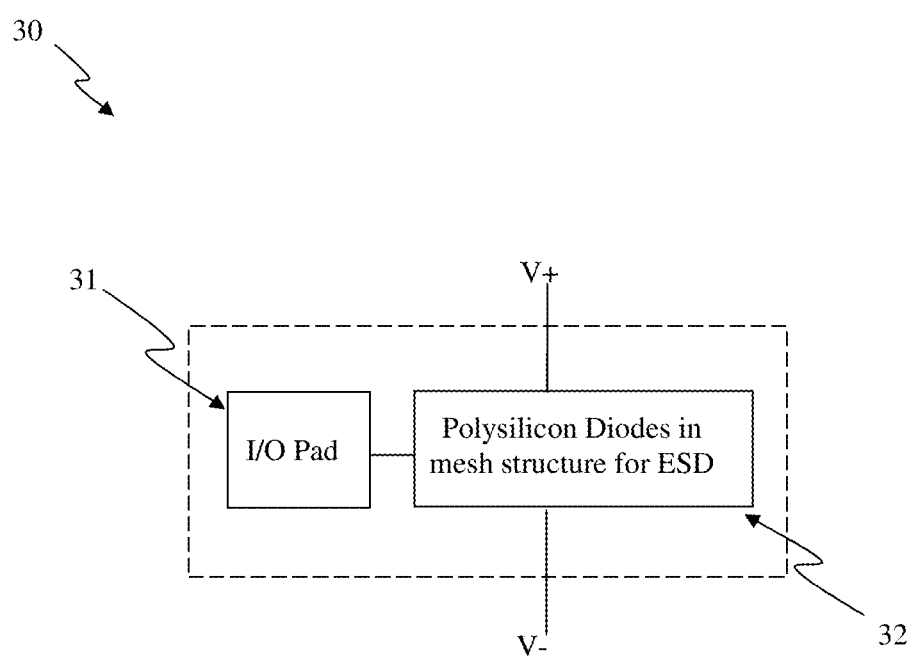
FIG. 4 shows a block diagram of an ESD protection structure using diodes in a mesh structure and an I/O pad according to one embodiment.

FIG. 4 shows a block diagram of an ESD protection device 30 using at least one mesh structures having at least one cell with at least one diode on at least one side according to one embodiment. In particular, the ESD protection device 30 includes an I/O pad 31 and diodes 32 built in at least one mesh-structure of cells. The I/O pad 31 can be coupled to an anode of the diodes 32 with the cathode coupled to a high voltage V+, and/or coupled to a cathode of the diodes 32 with the anode coupled to a low voltage V−. The couplings between anode(s) or cathode(s) of the diode(s) to external nodes can be through contacts, vias, or metals. In one implementation, the anode(s) and cathode(s) of the diode(s) can be coupled to a thermally conductive substrate through active areas. By turning on or breaking down the diodes, a high ESD voltage applied on the I/O pad can be clamped to the diodes' turn-on or breakdown voltages. Thus the internal devices of an integrated circuit coupled to an I/O pad can be protected from high ESD voltage damages.

Figure 5A:
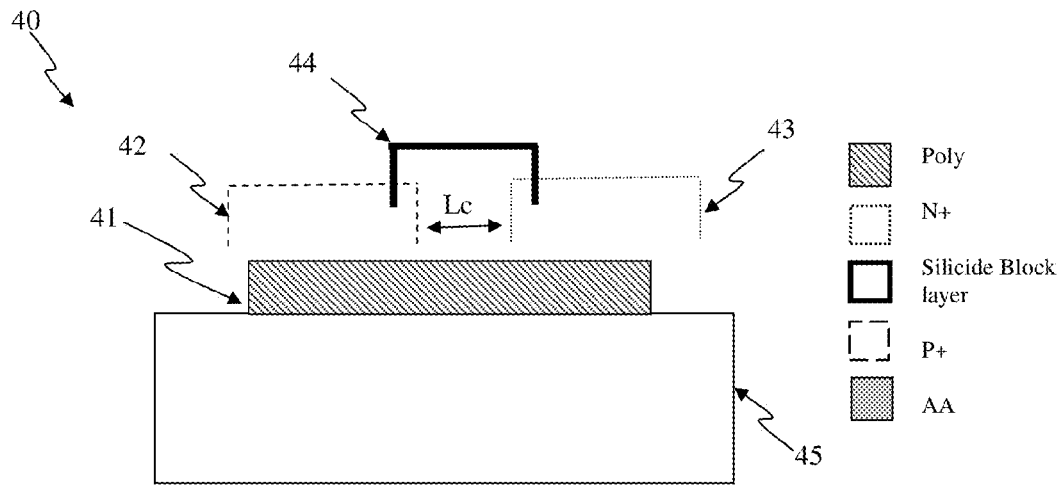
FIG. 5(a) shows a cross section of a polysilicon diode, corresponding to the diodes in FIG. 4, according to one embodiment.

FIG. 5(a) shows a cross section of a polysilicon diode 40, corresponding to one of the diodes 32 in FIG. 4, according to one embodiment. The polysilicon diode structure 40 has a polysilicon body 41 on an insulated substrate 45 that has a P+ implant 42 in one end and an N+ implant 43 in the other end. The N+ 43 and P+ 42 are separated with a space Lc that can be used to adjust the breakdown voltage of the polysilicon diode. A silicide block layer (SBL) 44 covers the P+/N+ space and overlaps into both regions to prevent a short due to silicide grown on the surface of the polysilicon 41. A portion of the N+ 43 and P+ 42 implant areas can be further coupled by contacts, vias, or metals (not shown in FIG. 5(a)) to external nodes as the cathode or anode of the polysilicon diode 40, respectively. The dopant concentration in the space between P+ and N+ can be in the intrinsic level, namely, the dopants are not intentionally introduced but can be slightly P type or N type due to out diffusion or contamination. In another embodiment, the dopants in the space can be implanted slightly N or P type to control the resistance of the polysilicon diode.

Figure 5B:
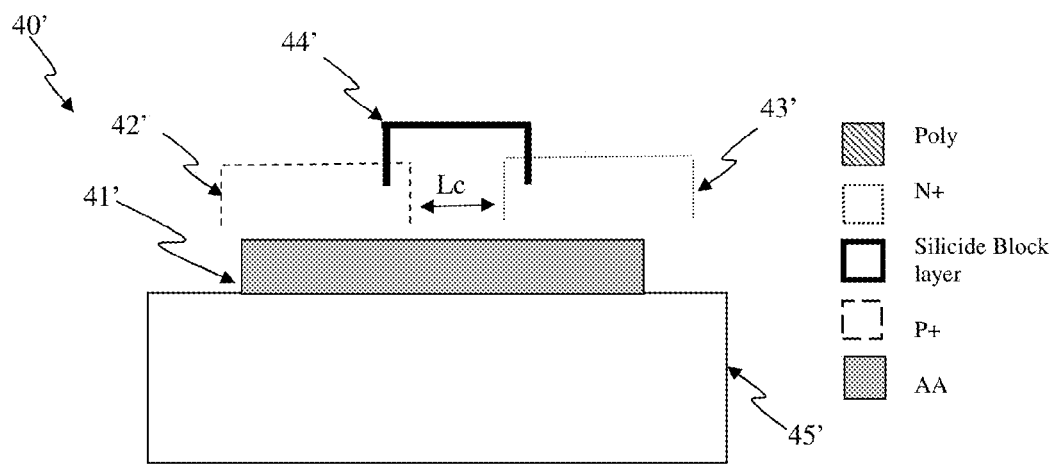
FIG. 5(b) shows a cross section of an active-region diode on an insulated substrate corresponding to the diodes in FIG. 4, according to another embodiment.

FIG. 5(b) shows a cross section of an active-region diode 40' on an SOI substrate 45', corresponding to one of the diodes 32 in FIG. 4, according to one embodiment. The active-region diode 40' has an active-region body 41' on an SOI substrate 45' that has a P+ implant 42' in one end and an N+ implant 43' in the other end. The N+ 43' and P+ 42' are separated with a space Lc that can be used to adjust the breakdown voltage of the active-region diode 40'. A silicide block layer (SBL) 44' covers the P+/N+ space and overlaps into both regions to prevent a short due to silicide grown on the surface of the active-region 41'. A portion of the N+ 43' and P+ 42' implant areas can be further coupled by contacts, vias, or metals (not shown in FIG. 5(b)) to external nodes as the cathode or anode of the active-region diode 40', respectively. The dopant concentration in the space between P+ and N+ can be in the intrinsic level, namely, the dopants are not intentionally introduced but can be slightly P type or N type due to out diffusion or contamination. In another embodiment, the dopants in the space can be implanted slightly N or P type to control the resistance of the active-region diode.

Figure 5C:
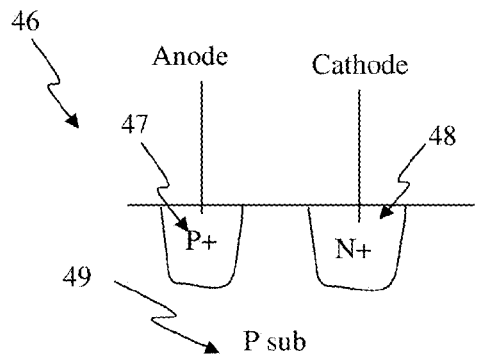
FIG. 5(c) shows a cross section of an active-region diode consisting of an N+ active region on a P substrate, corresponding to the diodes in FIG. 4, according to yet another embodiment.

FIG. 5(c) shows a cross section of an active-region diode 46 on a P type silicon substrate 49, corresponding to one of the diodes 32 in FIG. 4, according to another embodiment. The active region diode 46 has an anode and a cathode that consist of a P+ active region 47 and an N+ active region 48 on a P type substrate 49. The anode and cathode can be further coupled through contact(s), via(s), or metal(s) (not shown in FIG. 5(c)) as the P and N terminals, respectively, of a diode. The isolation between the P+ 47 and N+ 48 can be LOCS or STI in other embodiments.

Figure 5D:
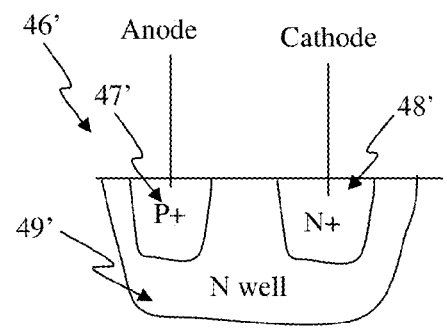
FIG. 5(d) shows a cross section of an active-region diode consisting of P+ active region on an N well, corresponding to the diodes in FIG. 4, according to yet another embodiment.

FIG. 5(d) shows a cross section of an active-region diode 46' with a P+ active region 47' and an N+ active region 48' on an N well 49', corresponding to one of the diodes 32 in FIG. 4, according to another embodiment. The active region diode 46' has an anode and a cathode that consist of a P+ active region 47' and an N+ active region 48' on an N well 49'. The anode and cathode can be further coupled through contact(s), via(s), or metal(s) (not shown in FIG. 5(d)) as the P and N terminals, respectively, of a diode. The isolation between the P+ 47' and N+ 48' can be LOCS or STI in other embodiments.

Figure 5E:
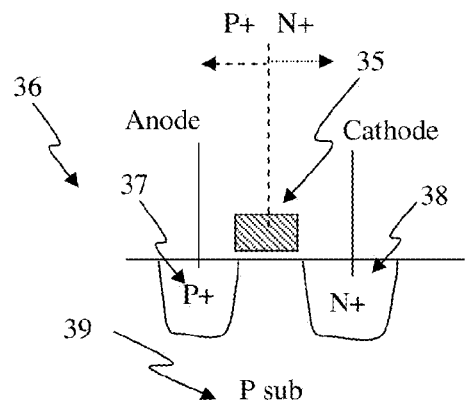
FIG. 5(e) shows a cross section of an active-region diode consisting of an N+ active region on a P substrate with dummy gate isolation, corresponding to the diodes in FIG. 4, according to yet another embodiment.

FIG. 5(e) shows a cross section of an active-region diode 36 on a P type silicon substrate 39, corresponding to one of the diodes 32 in FIG. 4, according to another embodiment. The active region diode 36 has an anode and a cathode that consist of a P+ active region 37 and an N+ active region 38 on a P type substrate 39. The anode and cathode can be further coupled through contact(s), via(s), or metal(s) (not shown in FIG. 5(e)) as the P and N terminals, respectively, of a diode. The isolation between the anode and cathode can be a dummy gate 35 with part N+ and part P+ implants to create N+ and P+ active regions 38 and 37, respectively. The dummy gate 35 can be coupled to a fixed bias voltage during normal operations. In other embodiment, the dummy gate 35 can be replaced by a silicide block layer for isolation.

Figure 5F:
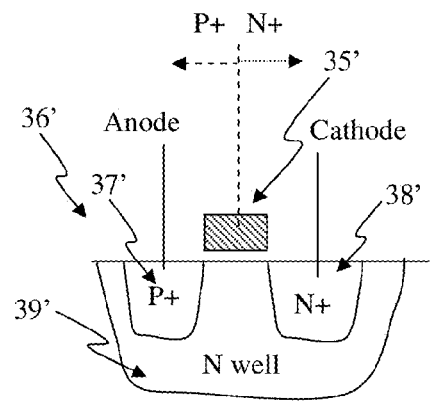
FIG. 5(f) shows a cross section of an active-region diode consisting of P+ active region on an N well with dummy gate isolation, corresponding to the diodes in FIG. 4, according to yet another embodiment.

FIG. 5(f) shows a cross section of an active-region diode 36' with a P+ active region 37' and an N+ active region 38' on an N well 39', corresponding to one of the diodes 32 in FIG. 4, according to another embodiment. The active region diode 36' has an anode and a cathode that consist of a P+ active region 37' and an N+ active region 38' on an N well 39'. The anode and cathode can be further coupled through contact(s), via(s), or metal(s) (not shown in FIG. 5(f)) as the P and N terminals, respectively, of a diode. The isolation between the anode and cathode can be a dummy gate 35' with part N+ and part P+ implants to create N+ and P+ active regions 38' and 37', respectively. The dummy gate 35' can be coupled to a fixed bias voltage during normal operations. In other embodiment, the dummy gate 35 can be replaced by a silicide block layer for isolation.

Figure 6A:
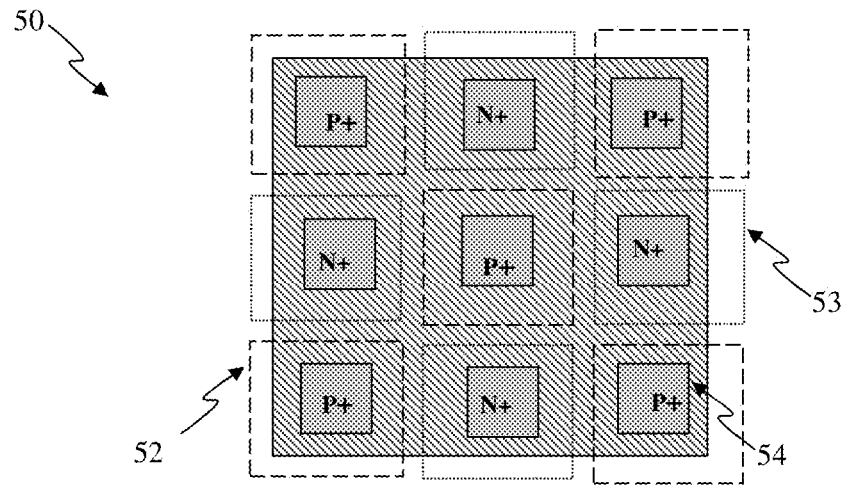
FIG. 6(a) shows a top view of diode cells in a 3×3 rectangular mesh structure according to one embodiment.

FIG. 6(a) shows a mesh structure 50 of cells containing diodes on a semiconductor body 51 according to one embodiment. The semiconductor body 51 has 3×3 rectangular cells with intersperse of cells covered by P+ implant 52 and N+ implant 53. Each P+ cell 52 is surrounded by N+ cells 53 in at least one side, and each N+ cell 53 is surrounded by P+ cells 52 in at least one side. A diode, like in FIG. 5(a)-5(f), is built in the interface between the P+ 52 and N+ 53 cells. The N+ implant 53 and P+ implant 52 are separated by a space. A silicide block layer (not shown) can cover the P+/N+ space and overlap into some or all of both implant regions. The doping concentration in the P+/N+ space can be intrinsic or slightly doped with N or P type. Alternatively, LOCOS, STI, dummy gate, or SBL can be used to isolate the P+ 52 and N+ 53 cells. An active area 54 can be built in at least one of the cells to couple the semiconductor body 51 to a thermally conductive substrate.

Figure 6B:
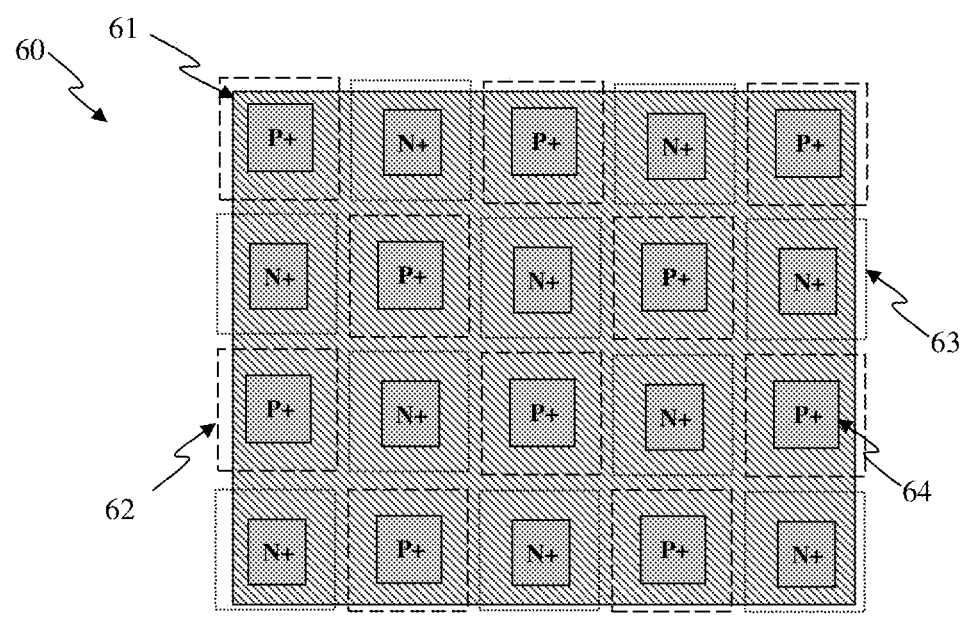
FIG. 6(b) shows a top view of diode cells in a 5×5 rectangular mesh structure according to another embodiment.

FIG. 6(b) shows a mesh structure 60 of cells containing diodes on a semiconductor body 61 according to one embodiment. The semiconductor body 61 has 4×7 rectangular cells with intersperse of cells covered by P+ implant 62 and N+ implant 63. Each P+ cell 62 is surrounded by N+ cells 63 in at least one side, and each N+ cell 63 is surrounded by P+ cells 62 in at least one side. A diode, like in FIG. 5(a)-5(f), is built in the interface between the P+ and N+ cells. The N+ implant 63 and P+ implant 62 are separated by a space. A silicide block layer (not shown) can cover the P+/N+ space and overlap into some or all of both implant regions. The doping concentration in the P+/N+ space can be intrinsic or slightly doped with N or P type. Alternatively, LOCOS, STI, dummy gate, or SBL can be used to isolate the P+ 62 and N+ 63 cells. An active area 64 can be built in at least one of the cells to couple the semiconductor body 61 to a thermally conductive substrate.

Figure 7A:
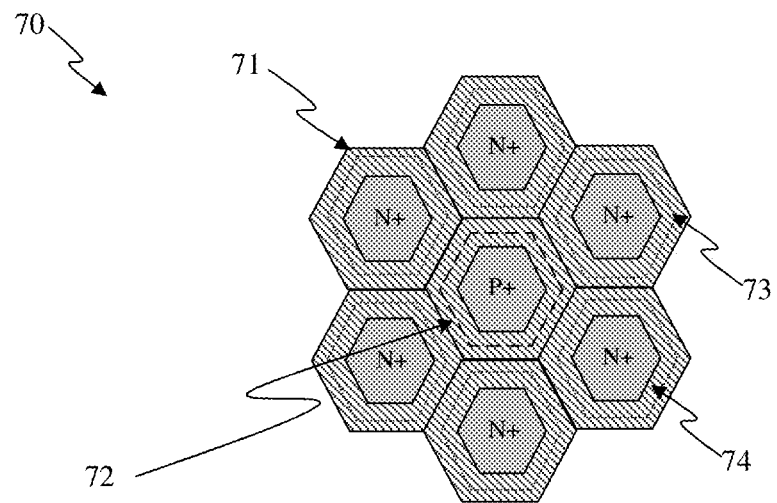
FIG. 7(a) shows a top view of diodes in hexagonal cells according to one embodiment.

FIG. 7(a) shows a mesh structure 70 of cells containing diodes on a semiconductor body 71 according to one embodiment. The semiconductor body 71 has a hexagon cell covered by P+ implant 72 in the center and six (6) hexagon cells covered by N+ implant 73 in each side. A diode, like in FIG. 5(a)-5(f), is built in the interface between the P+ and N+ cells. The N+ implant 73 and P+ implant 72 are separated by a space. A silicide block layer (not shown) can cover the P+/N+ space and overlap into some or all of both implant regions. The doping concentration in the P+/N+ space can be intrinsic or slightly doped with N or P type. Alternatively, LOCOS, STI, dummy gate, or SBL can be used to isolate the P+ 72 and N+ 73 cells. An active area 74 can be built in at least one of the cells to couple the semiconductor body 71 to a thermally conductive substrate. In another embodiment, the N+ implants 73 of the adjacent N+ hexagon cells can be merged.

Figure 7B:
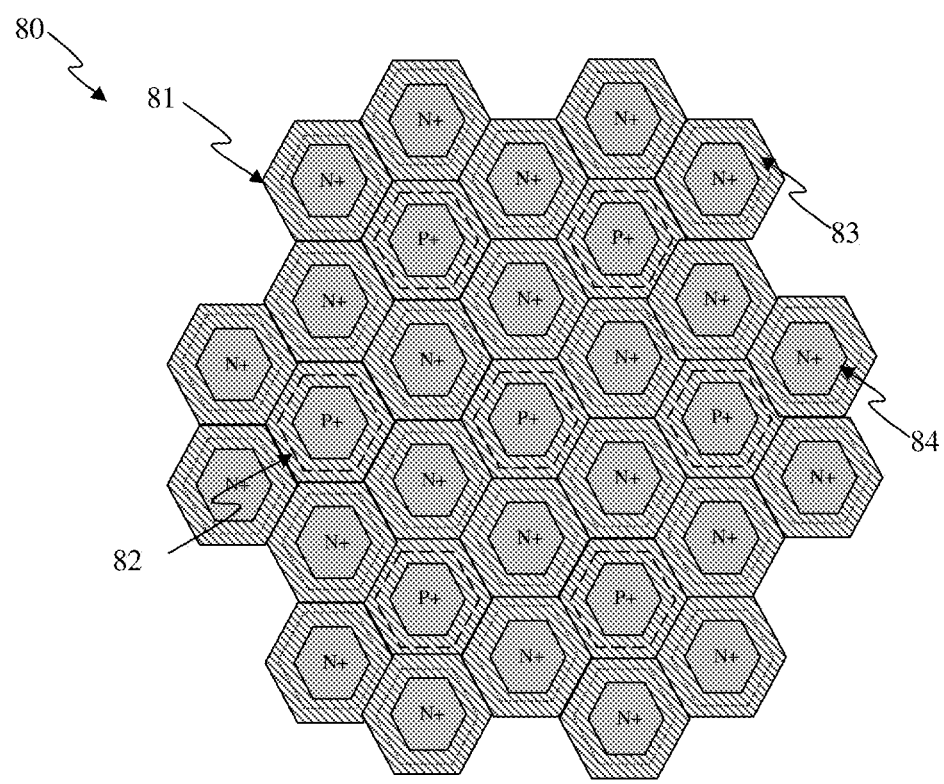
FIG. 7(b) shows a top view of a more complex diode structure in hexagonal cells according to one embodiment.

FIG. 7(b) shows a mesh structure 80 of cells containing diodes on a semiconductor body 81 according to one embodiment. The semiconductor body 81 has hexagon cells covered by P+ implant 82 in the center and hexagon cells covered by N+ implant 83 in at least one side. A diode, like in FIG. 5(a)-5(f), is built in the interface between the P+ and N+ cells. The N+ implant 83 and P+ implant 82 are separated by a space. A silicide block layer (not shown) can cover the P+/N+ space and overlap some or all of both implant regions. The doping concentration in the P+/N+ space can be intrinsic or slightly doped with N or P type. Alternatively, LOCOS, STI, dummy gate, or SBL can be used to isolate the P+ 82 and N+ 83 cells. An active area 84 can be built in at least one of the cells to couple the semiconductor body 81 to a thermally conductive substrate. In another embodiment, the N+ implants 83 of the adjacent N+ hexagon cells can be merged.

Figure 8A:
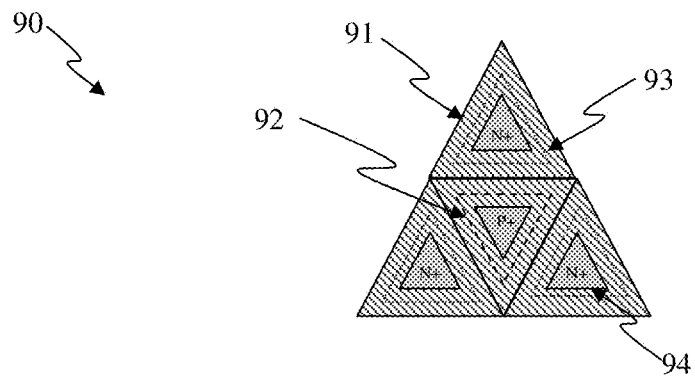
FIG. 8(a) shows a top view of diodes in a mesh structure of triangular cells according to one embodiment.

FIG. 8(a) shows a mesh structure 90 of cells containing diodes on a semiconductor body 91 according to one embodiment. The semiconductor body 91 has a triangular cell covered by P+ implant 92 in the center and one triangular cell covered by N+ implant 93 in each side. A diode, like in FIG. 5(a)-5(f), is built in the interface between the P+ and N+ cells. The N+ implant 93 and P+ implant 92 are separated by a space. A silicide block layer (not shown) can cover the P+/N+ space and overlap some all of both implant regions. The doping concentration in the P+/N+ space can be intrinsic or slightly doped with N or P type. Alternatively, LOCOS, STI, dummy gate, or SBL can be used to isolate the P+ 92 and N+ 93 cells. An active area 94 can be built in at least one of the cells to couple the semiconductor body 91 to a thermally conductive substrate.

Figure 8B:
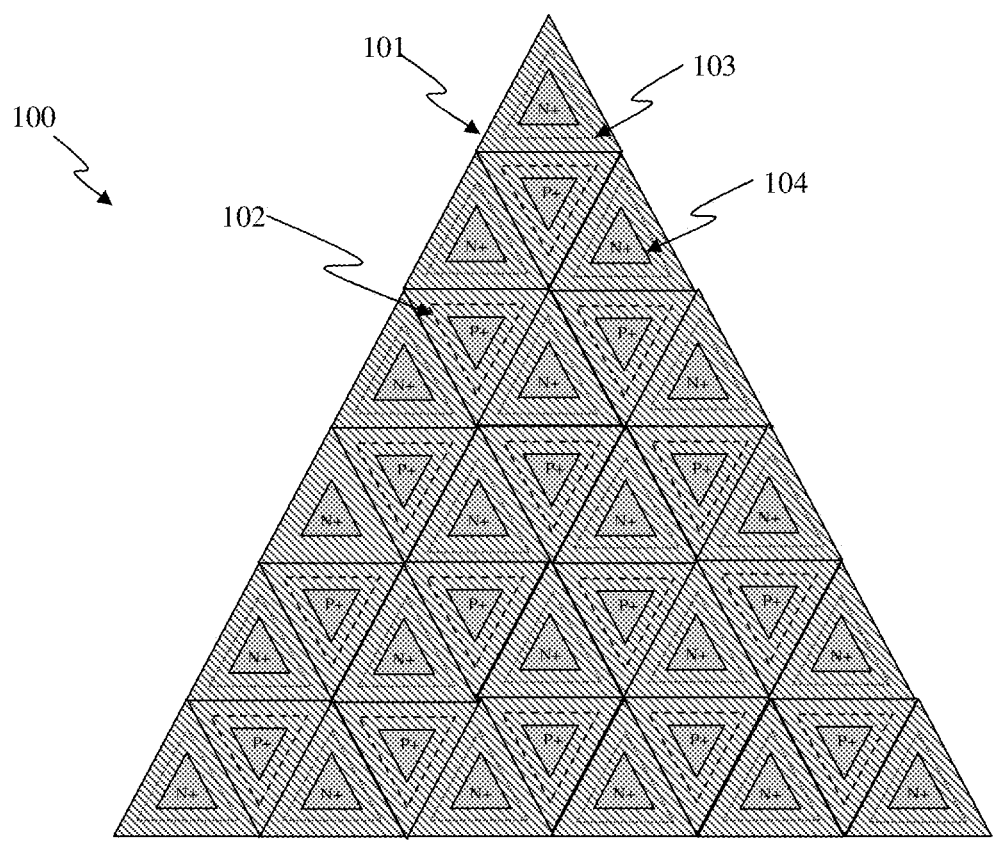
FIG. 8(b) shows a top view of a more complex diode structure in a mesh of triangular cells according to one embodiment.

FIG. 8(b) shows a mesh structure 100 of cells containing diodes on a semiconductor body 101 according to one embodiment. The semiconductor body 101 has triangular cells covered by P+ implant 102 in the center and has a triangular cell covered by N+ implant 103 in at least one side. A diode, like in FIG. 5(a)-5(f), is built in the interface between the P+ and N+ cells. The N+ implant 103 and P+ implant 102 are separated by a space. A silicide block layer (not shown) can cover the P+/N+ space and overlap some or all of both implant regions. The doping concentration in the P+/N+ space can be intrinsic or slightly doped with N or P type. Alternatively, LOCOS, STI, dummy gate, or SBL can be used to isolate the P+ 102 and N+ 103 cells. An active area 104 can be built in at least one of the cells to couple the semiconductor body 101 to a thermally conductive substrate. In another embodiment, the N+ implants of the adjacent N+ triangular cells can be merged.

Figure 9:
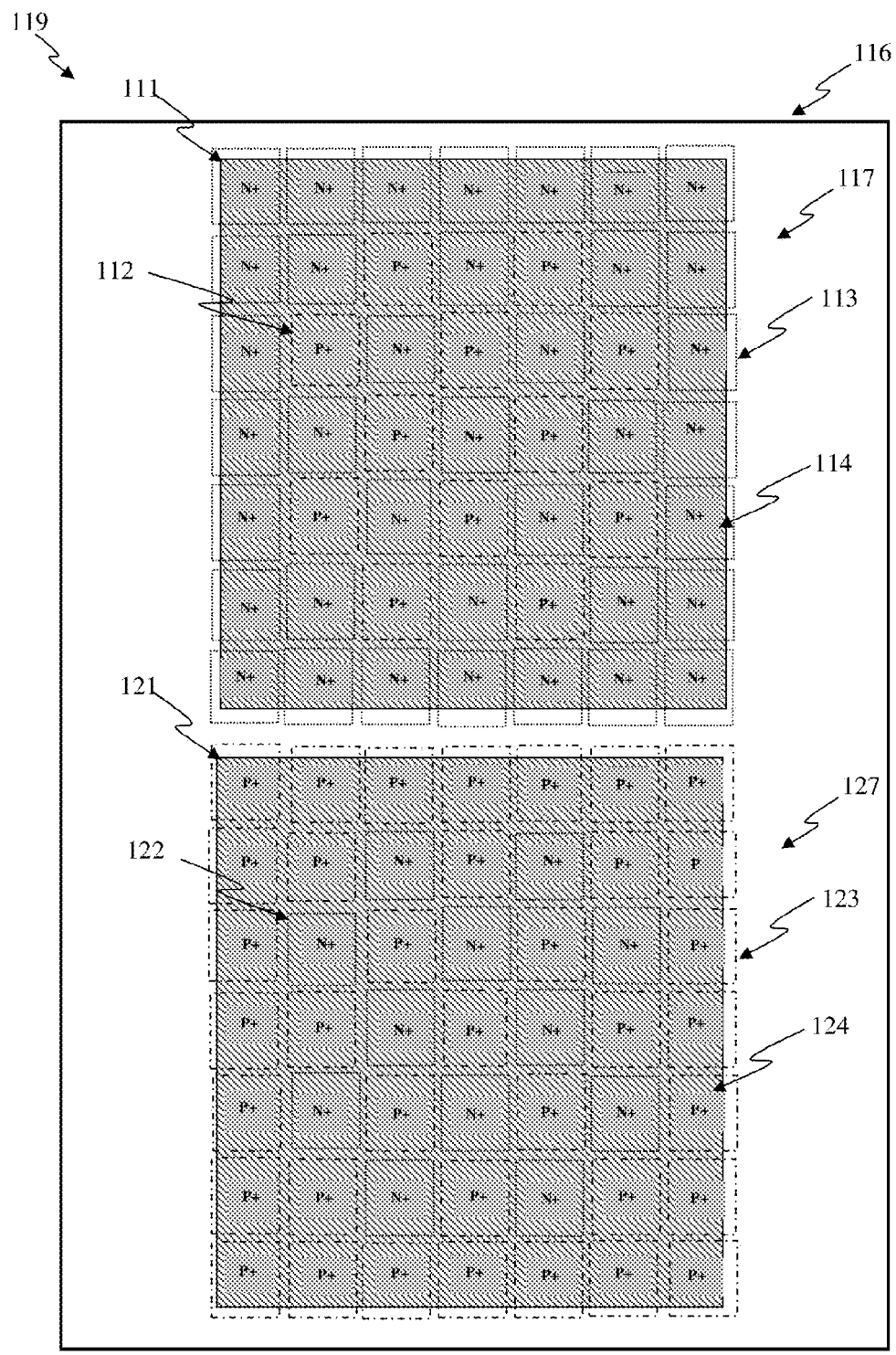
FIG. 9 shows a top view of an ESD protection structure that has an I/O pad and two mesh structures of diodes.

FIG. 9 shows an ESD protection structure 119 having an I/O pad 116 and two mesh structures 117 and 127 of cells containing diodes on semiconductor bodies 111 and 121, respectively, according to one embodiment. The semiconductor body 111 has rectangular cells covered by P+ implant 112 in the center with rectangular cells covered by N+ implant 113 in at least one side. The cells with N+ implant 113 are surrounded by cells implanted with P+ 112 in at least one side. A diode, like in FIG. 5(a)-5(f), is built in the interface between the P+ and N+ cells. The N+ implant 113 and P+ implant 112 are separated by a space. A silicide block layer (not shown) can cover the P+/N+ space and overlap some or all of both implant regions. The doping concentration in the P+/N+ space can be intrinsic or slightly doped with N or P type. Alternatively, LOCOS, STI, dummy gate, or SBL can be used to isolate the P+ 112 and N+ 113 cells. An active area 114 can be built in at least one of the cells to couple the semiconductor body 111 to a thermally conductive substrate. In another embodiment, the N+ implants of the adjacent N+ triangular cells can be merged.

The semiconductor body 121 in FIG. 9 has rectangular cells covered by P+ implant 123 in the center and surrounded by rectangular cells covered by N+ implant 122 in at least one side. The cells covered by N+ implant 122 are surrounded by the cells covered by P+ implant 123 in at least one side. A diode, like in FIG. 5(a)-5(f), is built in the interface between the P+ and N+ cells. The N+ implant 122 and P+ implant 123 are separated by a space. A silicide block layer (not shown) can cover the P+/N+ space and overlap into some or all of implant regions. The doping concentration in the P+/N+ space can be intrinsic or slightly doped with N or P type. Alternatively, LOCOS, STI, dummy gate, or SBL can be used to isolate the P+ 123 and N+ 122 cells. An active area 124 can be built in at least one of the cells to couple the semiconductor body 121 to a thermally conductive substrate. In another embodiment, the N+ implants of the adjacent N+ cells can be merged.

The two mesh structures 117 and 127 can construct an ESD protection for devices and circuits coupled to the I/O pad 116. In the mesh structure 117, the cells with P+ implant 112 can be coupled to the I/O pad 116 and the cells with N+ implant 113 can be coupled to VDD. Similarly, in the mesh structure 127, the cells with P+ implant 122 can be coupled to VSS and the cells with N+ implant 123 can be coupled to the I/O pad 116. When a high voltage is applied to the I/O pad 116, the diodes built in mesh structures 117 and 127 can be turned on or broken down to clamp the voltage to a low level and protect the internal circuits from high voltage damages. For better ESD protection, the outer cells in mesh structures 117 and 127 are better coupled to VDD or VSS on the semiconductor bodies 111 and 121, respectively.

The above discussions are for illustration purposes. There are many variations such as shapes of the cells can be circle, square, rectangle, triangle, hexagon, trapezoid, polygon, or any other shapes as long as the overall geometry construction can be very compact and expandable. The N+ and P+ implants can be interchanged. The dimension and the numbers of the cells may vary. The spacing between N+ and P+ may vary to adjust the breakdown voltage of the diodes. The overlaps of the silicide block layer (not shown in FIG. 6(*a*)-FIG. 9) into the N+ and P+ may vary to adjust the on-resistance of the diode. The doping concentration of the P+/N+ interface can be intrinsic or slightly N or P doped. The isolation between the P and N terminals of the junction diodes on silicon substrate can be LOCOS, STI, dummy gate, or silicide block layer (SBL) in standard CMOS technologies. Those skilled in the art understand that there are many equivalent constructions and embodiments of the structures that still fall within the scope of this invention.

Figure 10A:
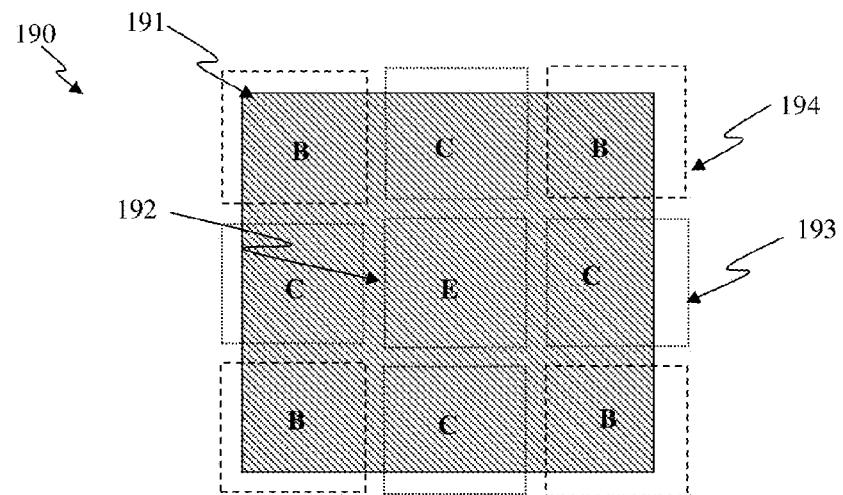
FIG. 10(a) shows a top view of emitter, collector, and base of an npn bipolar device in 3×3 rectangular cells constructed on a semiconductor body according to one embodiment.
Figure 10B:
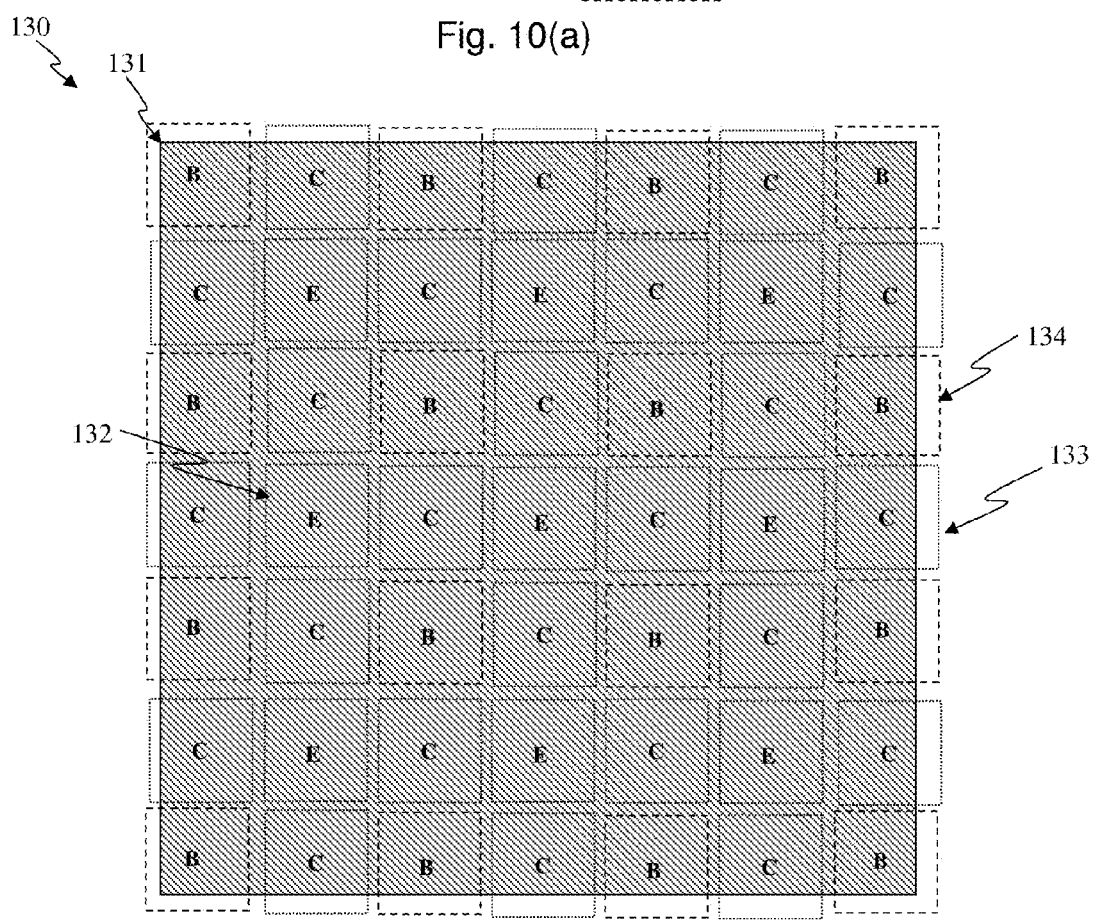
FIG. 10(b) shows a top view of emitter, collector, and base of an npn bipolar device in 7×7 rectangular cells constructed on a semiconductor body according to one embodiment.

Semiconductor on insulated substrate can be created with regions of N or P type of semiconductors that can be used to construct bipolar devices. Particularly, polysilicon or active-region body on SOI substrate can be created with regions of N or P type of semiconductor by implants to build bipolar devices among them. FIG. 10(*a*) shows a top view of a bipolar device 190 that has an emitter in a rectangular cell constructed on a polysilicon or active-region body 191. The polysilicon or active-region body 191 has cells covered by N+ 192, 193 and P+ implants 194 to construct rectangular cells in a 3×3 mesh. The emitter is a rectangular cell covered by an N+ implant 192 that have one rectangular cell in at least one side covered by an N+ implant 193 to serve as the collector of the bipolar, and have one rectangular cell near at least one vortex covered by a P+ implant 194 to serve as the extrinsic base of the bipolar. There are spaces between the N+ implants 192 and 193 of the emitter and collector interfaces to serve as intrinsic base areas. There are also spaces between the N+ implant 193 and the P+ implant 194 of collector and base interfaces to create P/N junctions. A silicide block layer (not shown) covers the space of emitter/collector and base/collector junctions and overlaps into at least one portion of both implant regions. The spaces between emitters and collectors can be lightly P doped and the spaces between bases and collectors can be intrinsic, or slightly P or N doped to optimize the performance of an NPN bipolar device.

FIG. 10(*b*) shows a top view of a bipolar device 130 that has a mesh structure of 3×3 emitters in rectangular cells constructed on a polysilicon or active-region body 131. The polysilicon or active-region body 131 has cells covered by N+ 132, 133, and P+ implants 134 to construct 3×3 rectangular emitter cells out of the total of 7×7 rectangular cells. Each emitter is a rectangular cell covered by an N+ implant 132 that has each side surrounded by at least one cell with an N+ implant 133 to serve as the collector of the bipolar, and has each vortex surrounded by at least one cell with a P+ implant 134 to serve as the extrinsic base of the bipolar. There are spaces between the N+ implants 132 and 133 of the emitter and collector interfaces to serve as intrinsic base areas. There are also spaces between the N+ implant 133 and the P+ implant 134 of collector and base interfaces to create P/N junctions. A silicide block layer (not shown) covers the space of emitter/collector and base/collector junctions and overlaps into at least one portion of both implant regions. The spaces between emitter and collectors can be lightly P doped and the spaces between bases and collectors can be intrinsic, or slightly P or N doped to optimize the performance of an NPN bipolar device. Other more complex structures can be constructed in a similar manner.

Figure 11A:
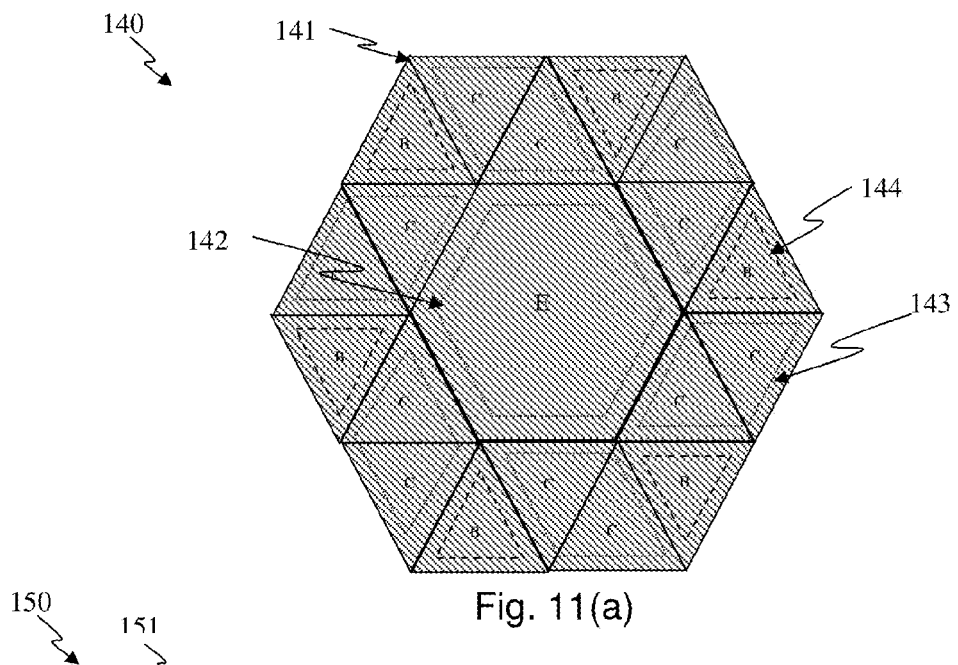
FIG. 11(a) shows a top view of emitter, collector, and base of an npn bipolar device in hexagon, parallelogram, and triangle cells, respectively, constructed on a semiconductor body according to one embodiment.
Figure 11B:
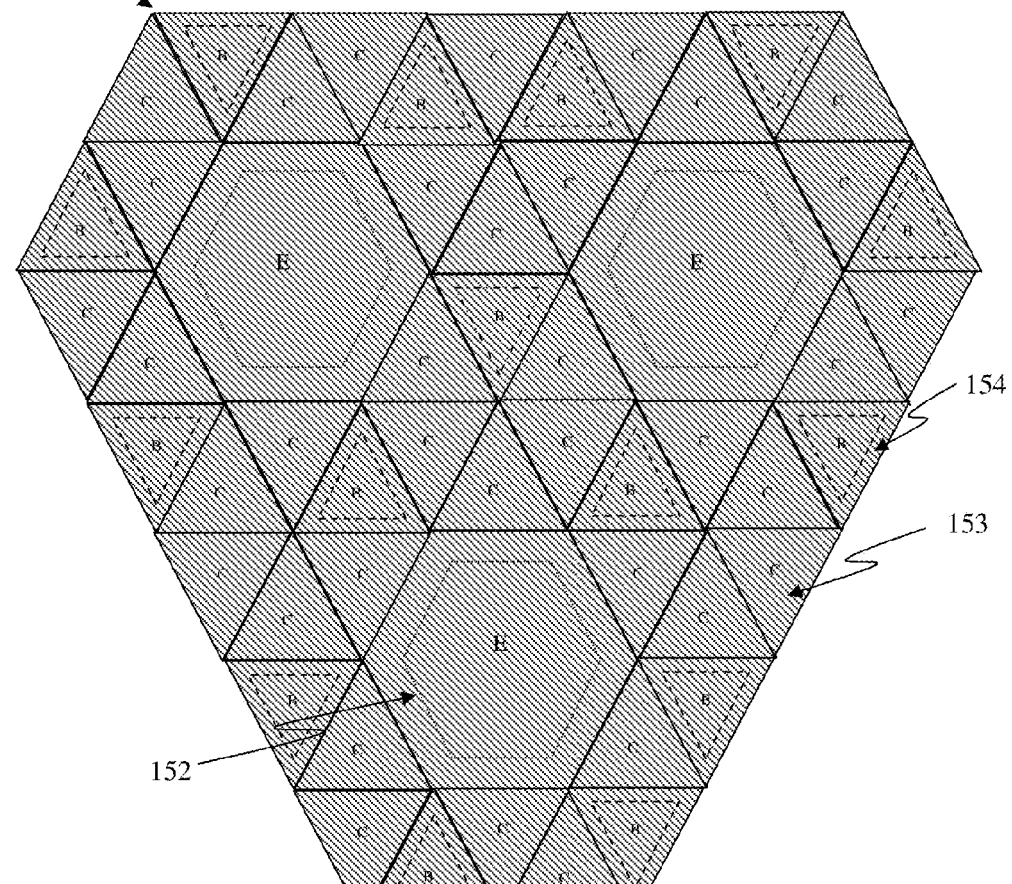
FIG. 11(b) shows a top view of a complex structure of emitter, collector, and base of an npn bipolar device in hexagon, parallelogram, and triangle cells, respectively, constructed on a semiconductor body according to one embodiment.

FIG. 11(*a*) shows a top view of a bipolar device 140 that has one emitter in a hexagonal cell constructed on a polysilicon or active-region body 141. The polysilicon or active-region body 141 has cells with N+ 142, 143 and P+ implants 144 to cover the one hexagonal emitter in the center and surrounding triangular or parallelogram cells as bases or collectors. The center emitter is a hexagonal cell covered by an N+ implant 142 that has each side surrounded by at least one parallelogram cell covered by an N+ implant 143 to serve as the collector of a bipolar, and has each vortex surrounded by at least one cell covered by a P+ implant 144 to serve as the extrinsic base of the bipolar. There are spaces between N+ implant regions 142 and 143 of the emitter and collector interfaces to serve as the intrinsic base. There are also spaces between P+ implant 144 and N+ implant 143 of the base and collector interfaces to create P/N junctions. A silicide block layer (not shown) covers the space between emitter/collector and base/collect and overlaps into at least one portion of both implant regions. The spaces between emitter and collector can be lightly P doped. The spaces between the extrinsic base and collector can be intrinsic or slightly N or P doped to optimize the performance of an NPN bipolar device.

FIG. 11(*b*) shows a top view of a bipolar device 150 that has three (3) emitters in hexagonal cells constructed on a polysilicon or active-region body 151. The polysilicon or active-region body 151 has cells with N+ 152, 153, and P+ implants 154 to cover three (3) hexagonal emitters in the center and surrounding triangular or parallelogram cells as bases or collectors, respectively. The center emitter is a hexagonal cell covered by an N+ implant 152 that has at least one side surrounded by at least one parallelogram cell covered by an N+ implant 153 to serve as the collector of a bipolar, and has at least one vortex surrounded by at least one triangular cell covered by a P+ implant 154 to serve as extrinsic base of the bipolar. There are spaces between N+ implant regions 152 and 153 of the emitter and collector interfaces to serve as the intrinsic base. There are also spaces between P+ implant 154 and N+ implant 153 of base and collector interfaces to create P/N junctions. A silicide block layer (not shown) covers the space between emitter/collector and base/collect and overlaps into at least one portion of both implant regions. The spaces between emitter and collector can be lightly P doped. The spaces between the extrinsic base and collector can be intrinsic or slightly N or P doped to optimize the performance of an NPN bipolar device. Other more complex structures can be constructed in a similar manner.

Figure 12A:
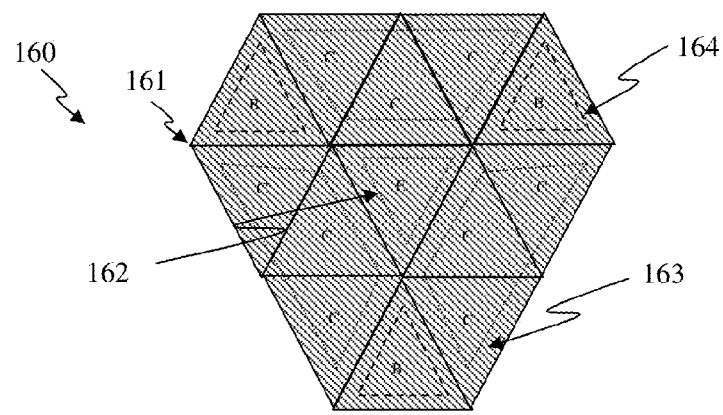
FIG. 12(a) shows a top view of emitter, collector, and base of an npn bipolar device in triangle, trapezoid, and triangle cells, respectively, constructed on a semiconductor body according to one embodiment.

FIG. 12(*a*) shows a top view of a bipolar device 160 that has one emitter in a triangular cell constructed on a polysilicon or active-region body 161. The polysilicon or active-region body 161 has N+ 162, 163 and P+ implants 164 to cover one triangular emitter in the center and surrounding triangular or trapezoidal cells as bases or collectors. The center emitter is a triangular cell covered by an N+ implant 162 that has at least one side surrounded by at least one trapezoidal cell covered by an N+ implant 163 to serve as the collector of a bipolar, and has at least one vortex surrounded by at least one triangular cell covered by a P+ implant 164 to serve as the extrinsic base of the bipolar. There are spaces between N+ implant regions 162 and 163 of the emitter and collector interfaces to serve as the intrinsic base. There are also spaces between P+ implant 164 and N+ implant 163 of base and collector interfaces to create P/N junctions. A silicide block layer (not shown) covers the space between emitter/collector and base/collect and overlaps into at least one portion of both implant regions. The spaces between emitter and collector can be lightly P doped. The spaces between the extrinsic base and collector can be intrinsic or slightly N or P doped to optimize the performance of an NPN bipolar device.

Figure 12B:
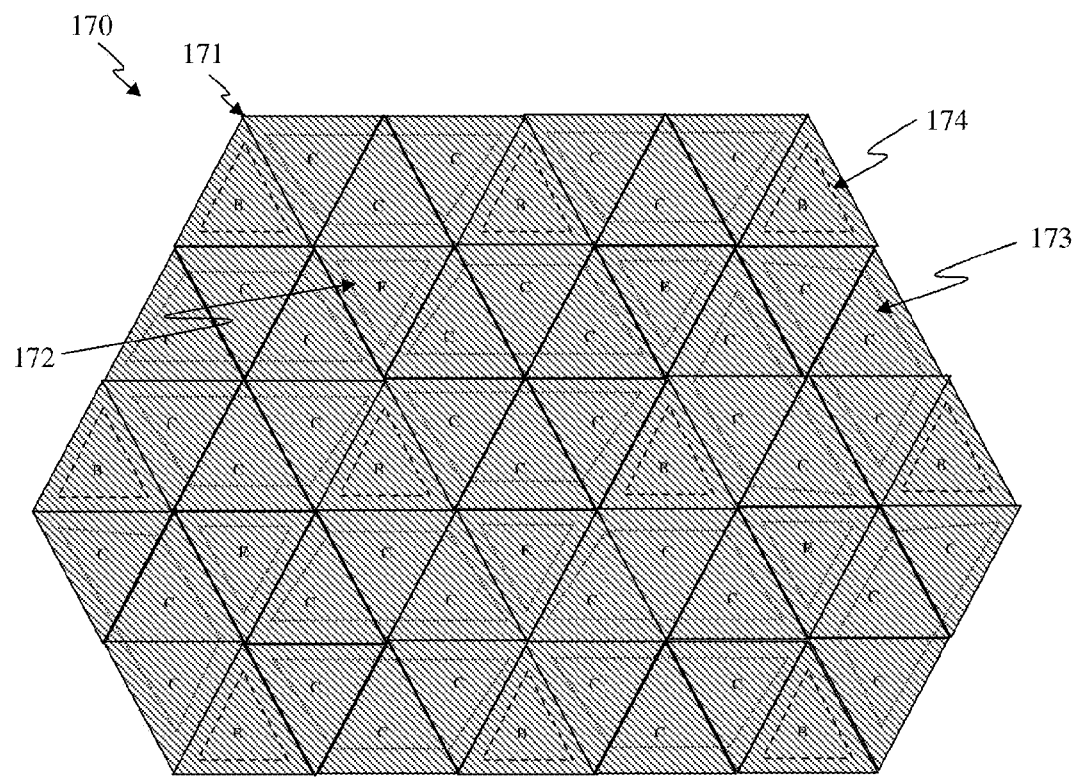
FIG. 12(b) shows a top view of a complex structure of emitter, collector, and base of an npn bipolar device in triangle, trapezoid, and triangle cells, respectively, constructed on a semiconductor body according to one embodiment.

FIG. 12(b) shows a top view of a bipolar device 170 that has emitters in triangular cells constructed on a polysilicon or active-region body 171. The polysilicon or active-region body 171 has cells with N+ 172, 173 and P+ implants 174 to cover one triangular emitter in the center and surrounding triangular or trapezoidal cells as bases or collectors. The center emitter is a triangular cell covered by an N+ implant 172 that has at least one side surrounded by at least one trapezoidal cell covered by an N+ implant 173 to serve as the collector of a bipolar, and has at least one vortex surrounded by at least one cell triangular cell covered by a P+ implant 174 to serve as the extrinsic base of the bipolar. There are spaces between N+ implant regions 172 and 173 of the emitter and collector interfaces to serve as the intrinsic bases. There are also spaces between P+ implant 174 and N+ implant 173 of base and collector interfaces to create P/N junctions. A silicide block layer (not shown) covers the space between emitter/collector and base/collect and overlaps into at least one portion of both implant regions. The spaces between emitter and collector can be lightly P doped. The spaces between the extrinsic base and collector can be intrinsic or slightly N or P doped to optimize the performance of an NPN bipolar device. More complex structures can be constructed in a similar manner.

Figure 13A:
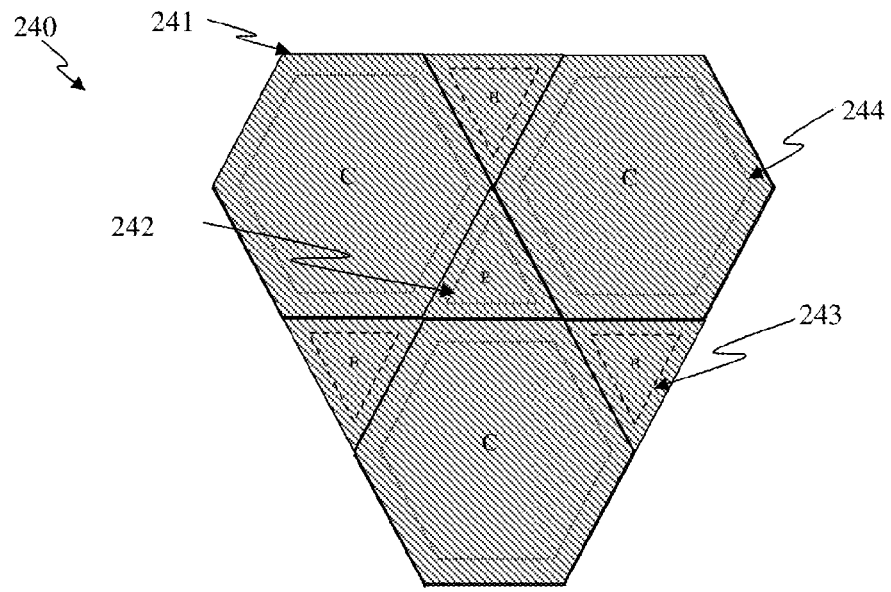
FIG. 13(a) shows a top view of emitter, collector, and base cells of a bipolar device constructed from a triangle, hexagon, and triangle, respectively, on a semiconductor body according to one embodiment.

FIG. 13(a) shows a top view of a bipolar device 240 that has one emitter in a triangular cell constructed on a polysilicon or active-region body 241. The polysilicon or active-region body 241 has cells with N+ 242, 243 and P+ implants 244 to cover the one triangular emitter in the center, three (3) surrounding triangular and hexagonal cells as bases or collectors, respectively. The center emitter is a hexagonal cell covered by an N+ implant 242 that has at least one side surrounded by at least one hexagonal cell covered by an N+ implant 243 to serve as the collector of a bipolar, and has at least one vortex surrounded by at least one triangular cell covered by a P+ implant 244 to serve as the extrinsic Base of the bipolar. There are spaces between N+ implant regions 242 and 243 of the emitter and collector interfaces to serve as the intrinsic base. There are also spaces between P+ implant 244 and N+ implant 243 of the base and collector interfaces to create P/N junctions. A silicide block layer (not shown) covers the space between emitter/collector and base/collect and overlaps into at least one portion of both implant regions. The spaces between emitter and collector can be lightly P doped. The spaces between the extrinsic base and collector can be intrinsic or slightly N or P doped to optimize the performance of an NPN bipolar device.

Figure 13B:
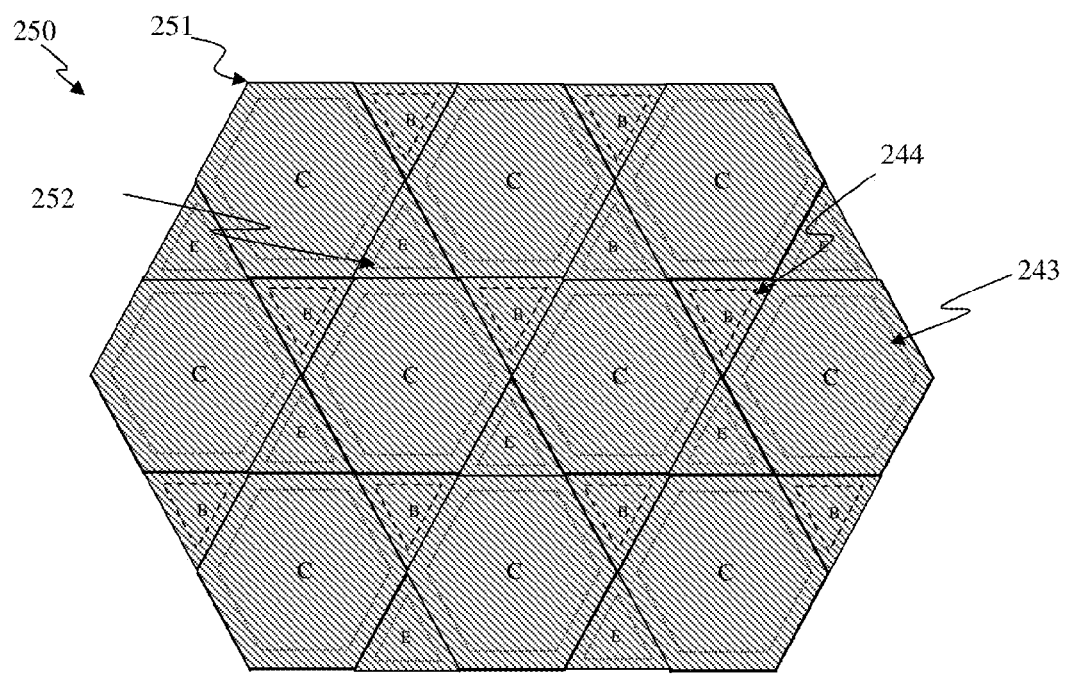
FIG. 13(b) shows a top view of a complex cell structure of emitter, collector, and base of a bipolar device constructed from a triangle, hexagon, and triangle, respectively, on a semiconductor body according to one embodiment.

FIG. 13(b) shows a top view of a bipolar device 250 that has three (3) emitters in hexagonal cells constructed on a polysilicon or active-region body 251. The polysilicon or active-region body 251 has cells with N+ 252, 253, and P+ implants 254 to cover the hexagonal emitters in the center, surrounded by triangular or hexagonal cells as bases or collectors, respectively. The center emitter is a hexagonal cell covered by an N+ implant 252 that has at least one side surrounded by at least one hexagonal cell covered by an N+ implant 253 to serve as the collector of a bipolar, and has at least one vortex surrounded by at least one triangular cell covered by a P+ implant 254 to serve as extrinsic base of the bipolar. There are spaces between N+ implant regions 252 and 253 of the emitter and collector interfaces to serve as the intrinsic base. There are also spaces between P+ implant 254 and N+ implant 253 of base and collector interfaces to create P/N junctions. A silicide block layer (not shown) covers the space between emitter/collector and base/collect and overlaps into at least one portion of both implant regions. The spaces between emitters and collectors can be lightly P doped. The spaces between the extrinsic bases and collectors can be intrinsic or slightly N or P doped to optimize the performance of an NPN bipolar device. Other more complex structures can be constructed in a similar manner.

The above discussions of various bipolar devices built on polysilicon or active-region body and mesh ESD structures built on polysilicon, active region, or junction diodes are for illustration purposes. The polysilicon or active-region body structure can be on a conductive substrate through a dielectric, such as SiO2 on a silicon substrate, or SOI (Silicon on Insulator) or can be on a non-conductive substrate, such as mylar, plastic, glass, or paper, etc. The substrate can be a film or a bulk. The N+ or P+ implant can be interchangeable. The widths of the gaps between P+/N+ or N+/N+ can be adjusted to change polysilicon or active region's P/N junction breakdown voltage. The SBL can be used to prevent shorts between P+ and N+ region and can overlap into any N+ or P+ areas to further adjust the turn-on resistance. The active areas (AAs) can be introduced in any places to couple to a thermally conductive substrate.

The basic cells in the mesh structures of the ESD can be circle, square, rectangle, triangle, hexagon, polygon, or any shapes as long as they are compact and expandable. The spacing between P+ and N+ is preferable close to the minimum channel length of a CMOS technology. The ratio of the length of the basic cells to the P+/N+ spacing is preferable between 2 to 7 for better optimization. The numbers of the supply voltages can be more than 2, i.e. VDD and VSS. The diodes can be stacked in serial from an I/O pad to VDD/VSS to further reduce the input capacitance of an I/O pad.

The emitter cells in a mesh structure to construct bipolar junction transistor on a semiconductor body can be square, rectangle, triangle, hexagon, or other polygons. The cells in at least one side or vortex of the emitter cells can be any polygons as long as the overall geometry construction can be very compact and expandable. The intrinsic base width is preferable to be close to the minimum channel length of a CMOS technology. The length in at least one side of the emitter polygon to the intrinsic base width ratio is preferable to be between 2 to 7 to optimize the bipolar performance. The same construction for NPN polysilicon or active-region body bipolar devices can be applied to PNP polysilicon or active-region body bipolar devices as well. Those skilled in the art understand that there are many varieties and equivalent embodiments that are within the scope of this invention.

The invention can be implemented in a part or all of an integrated circuit in a Printed Circuit Board (PCB), or in a system. The ESD structures can comprise one or plural of mesh structures of polysilicon, active-region, or junction diodes. Each mesh structure of polysilicon, active-region, or junction diodes can comprise one terminal coupled to an I/O pad and the other terminal coupled to a supply voltage.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A diode constructed in a mesh structure including a plurality of cells on a semiconductor body, the mesh structure comprising:
   at least one cell with a first type of implant surrounded by at least one cell with a second type of implant in at least one side;
   at least one cell with the second type of implant surrounded by at least one cell with the first type of implant in at least one side; and
   an isolation region between the first and the second type of implants to form P/N junctions in at least one side of the cell on the semiconductor body, and
   wherein regions with the first implant are coupled to serve as a first terminal of the diode, and regions with the second implant are coupled to serve as a second terminal of the diode,
   wherein the P/N junctions of the isolation region provide ESD protection for the cell on the semiconductor body in accordance with a breakdown voltage between the P/N junctions of the isolation region.

2. A diode as recited in claim 1, wherein the semiconductor body comprises polysilicon, or active region on an insulated substrate, or a silicon substrate.

3. A diode as recited in claim 1, wherein the isolation region between the first and the second type of implant regions comprises LOCOS (LOCal Oxidation), STI (Shallow Trench Isolation), dummy gate, or Silicide Block Layer (SBL).

4. A diode as recited in claim 1, wherein a contour of at least one of the cells is a circle, square, rectangle, triangle, hexagon, or polygon.

5. A diode as recited in claim 1, wherein the P/N junctions of the isolation region are separated by a space to control the breakdown voltage between the P/N junctions of the isolation region.

6. An ESD protection structure in an integrated circuit, the ESD protection circuit comprising:
   an I/O pad and at least one mesh structure including plurality of cells on a semiconductor body, the at least one mesh structure comprising:
      at least one of the cells having a first type of implant surrounded by at least one of the cells with a second type of implant in at least one side of the cell;
      at least one of the cells with a second type of implant surrounded by at least one of the cells with a first type of implant in at least one side of the cell; and
      an isolation region between the first and the second type of implant regions to form P/N junctions in at least one side of the cell on the semiconductor body;
   wherein the P/N junctions of the isolation region provide ESD protection for the cell on the semiconductor body in accordance with a breakdown voltage between the P/N junctions of the isolation region,
   wherein the regions with the first implant are coupled to serve as a first terminal of the at least one diode and the regions with the second implant are coupled to serve as a second terminal of the at least one diode, and
   wherein the first terminal of the at least one diode is coupled to the I/O pad while the second terminal is coupled to a supply voltage.

7. An ESD protection structure as recited in claim 6, wherein the semiconductor body comprises a polysilicon, or active region on an insulated substrate, or a silicon substrate.

8. An ESD protection structure as recited in claim 6, wherein the isolation region between the first and the second type of implant regions comprises LOCOS (LOCal Oxidation), STI (Shallow Trench Isolation), dummy gate, or Silicide Block Layer (SBL).

9. An ESD protection structure as recited in claim 6, wherein a contour of at least one of the cells is a circle, square, rectangle, triangle, hexagon, or polygon.

10. An ESD protection structure as recited in claim 6, wherein the mesh structure is comparable to the I/O pad size and/or partially or wholly hidden under the I/O pad.

11. An electronic system, comprising:
   at least one integrated circuit; the integrated circuit including at least one ESD protection structure that has a mesh structure of cells on a semiconductor body, and has at least one diode formed in the mesh structure, wherein the mesh structure comprises:
      at least one of the cells with a first type of implant surrounded by at least one cells with a second type of implant in at least one side, and at least one of the cells with a second type of implant surrounded by at least one cells with a first type of implant in at least one side; and
      an isolation between the first and the second implant regions in at least one side of the cells to construct P/N junctions;
   wherein the first and the second type of implant regions serve as the first and the second terminals of the at least one diode,
   wherein the first terminal of the diode being coupled to an I/O pad and the second terminal of the diode being coupled to a supply voltage to protect the devices and/or circuits coupled to the I/O pad from high voltage surges, and
   wherein the P/N junctions of the isolation provide ESD protection for the cells on the semiconductor body in accordance with a breakdown voltage between the P/N junctions.

12. An electronic system as recited in claim 11, wherein the semiconductor body comprises a polysilicon, or active region on an insulated substrate, or a silicon substrate.

13. An electronic system as recited in claim 11, wherein the isolation between the first and the second type of implant regions comprises LOCOS (LOCal Oxidation), STI (Shallow Trench Isolation), dummy gate, or Silicide Block Layer (SBL).

14. An electronic system as recited in claim 11, wherein contour of at least one of the cells is a circle, square, rectangle, triangle, hexagon, or polygon.

15. An electronic system as recited in claim 11, wherein at least one of the cells is coupled to an active area that is thermally coupled to a conductive substrate.

16. An electronic system as recited in claim 11,
   wherein the ESD protection structure has a second mesh structure, with at least one diode constructed therein.

17. An electronic system as recited in claim 16,
   wherein the first mesh structure has a first terminal for the at least one other diode coupled to an I/O pad and a second terminal for the at least one diode coupled to a first supply voltage, and
   wherein the second mesh structure has a second terminal of the at least one other diode coupled to the I/O pad and a first terminal of the at least one other diode coupled to a second supply voltage.

* * * * *